US009793685B2

(12) United States Patent
Wang et al.

(10) Patent No.: US 9,793,685 B2
(45) Date of Patent: Oct. 17, 2017

(54) JUNCTIONLESS SEMICONDUCTOR LIGHT EMITTING DEVICES

(75) Inventors: Deli Wang, San Diego, CA (US); Muchuan Yang, La Jolla, CA (US); Chun Li, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 827 days.

(21) Appl. No.: 14/117,560

(22) PCT Filed: May 24, 2012

(86) PCT No.: PCT/US2012/039352
§ 371 (c)(1),
(2), (4) Date: Jun. 18, 2014

(87) PCT Pub. No.: WO2012/162506
PCT Pub. Date: Nov. 29, 2012

(65) Prior Publication Data
US 2014/0291609 A1    Oct. 2, 2014

Related U.S. Application Data

(60) Provisional application No. 61/489,664, filed on May 24, 2011.

(51) Int. Cl.
*H01L 33/00*  (2010.01)
*H01S 5/34*  (2006.01)
*H01J 63/06*  (2006.01)

(52) U.S. Cl.
CPC .......... *H01S 5/3401* (2013.01); *H01J 63/06* (2013.01); *H01L 33/0004* (2013.01)

(58) Field of Classification Search
CPC .................. H01L 33/0004; H01L 33/0033
See application file for complete search history.

(56) References Cited

U.S. PATENT DOCUMENTS

| 2005/0179366 | A1* | 8/2005 | Rose ............... | H01J 1/3044 |
| | | | | 313/503 |
| 2007/0181906 | A1 | 8/2007 | Chik et al. | |
| 2009/0167146 | A1* | 7/2009 | Yang ............... | H01J 61/42 |
| | | | | 313/495 |
| 2011/0297846 | A1* | 12/2011 | Wang ............... | H01J 63/06 |
| | | | | 250/459.1 |

FOREIGN PATENT DOCUMENTS

| KR | 10-0697656 | 3/2007 |
| WO | WO 2010-062644 | 6/2010 |
| WO | WO 2010-065860 | 6/2010 |

* cited by examiner

*Primary Examiner* — Lex Malsawma
*Assistant Examiner* — J. R. Oakley
(74) *Attorney, Agent, or Firm* — Greer, Burns & Crain; Steven P. Fallon

(57) ABSTRACT

A junctionless light emitting device comprises a field emitter cathode, and a light emitting semiconductor material sandwiched between an ohmic contact (OC) that faces the injected electrons and a Schottky contact (SC). The field emitter cathode is configured to inject electrons into the ohmic contact.

19 Claims, 27 Drawing Sheets

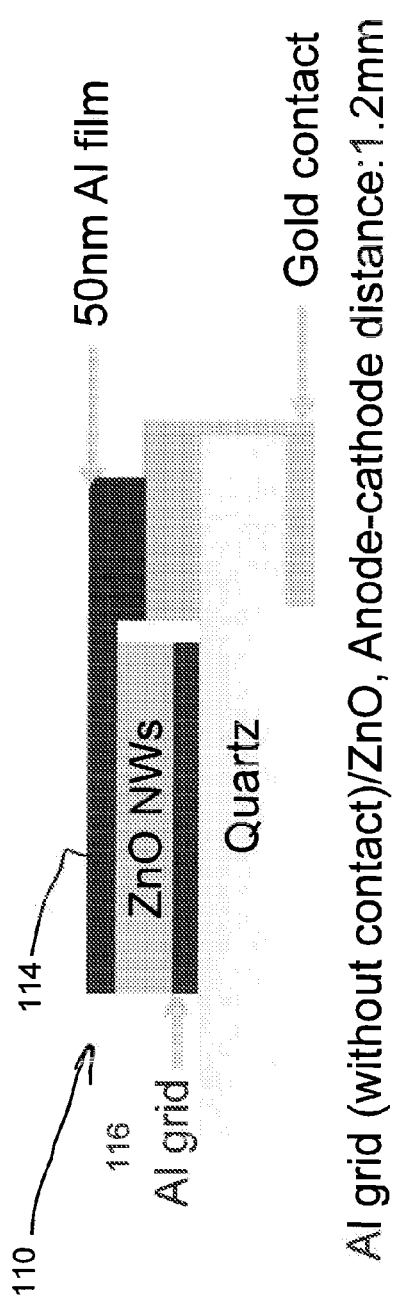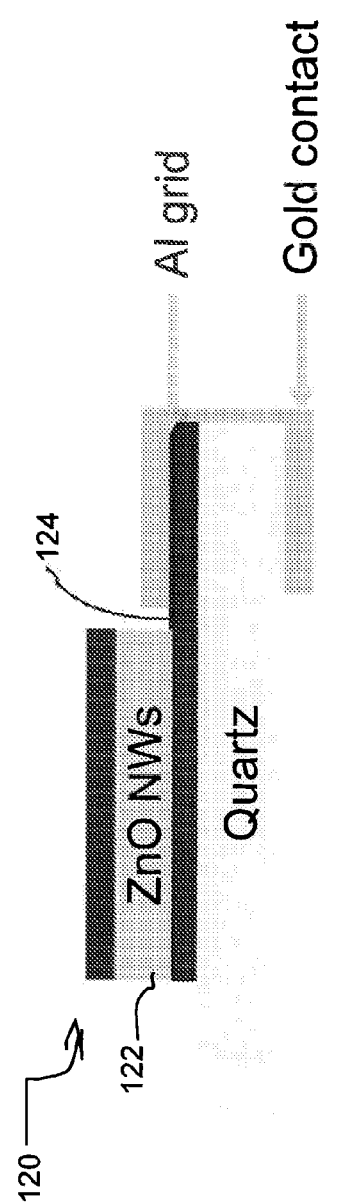
FIG. 7A
FIG. 7B

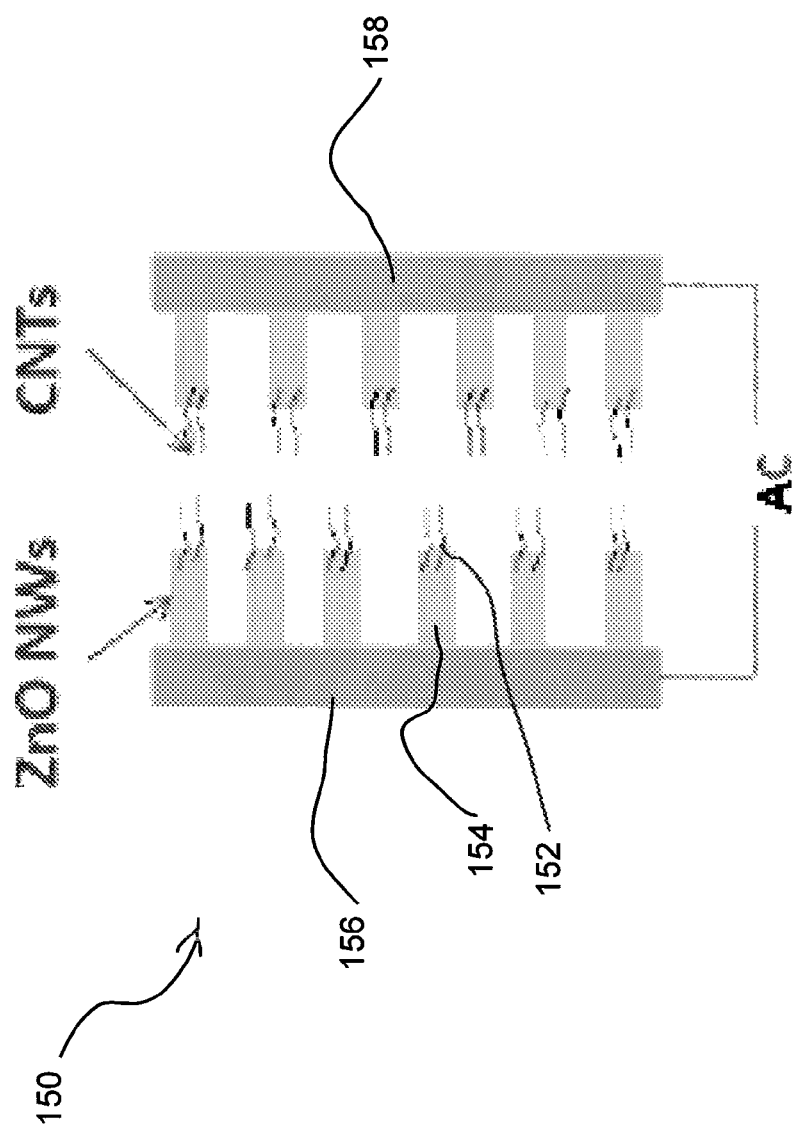

AC design

DC design

JUNCTIONLESS SEMICONDUCTOR LIGHT EMITTING DEVICES

PRIORITY CLAIM AND REFERENCE TO RELATED APPLICATION

This application claims the benefit of U.S. Provisional Application Ser. No. 61/489,664, filed May 24, 2011, under 35 U.S.C. §119.

TECHNICAL FIELD

A field of the invention is electricity to light energy conversion. Example devices include light emitting diodes (LEDs) and lasers.

BACKGROUND

Addressing the increasing worldwide demand for energy requires strategies for more efficient energy use as well as sustainable approaches to energy generation and conservation. Lighting is a major contributor to electricity consumption, currently accounting for 19% of global use and 34% for the U.S. The U.S. lighting market is currently divided among various lamp types: 63% incandescent, 35% fluorescent, 2% halogen. Among these, the incandescent light bulb is only 5% efficient (15 lm/W) while the fluorescent lamp has 15-25% efficiency (50-80 lm/W). The appreciable energy savings that come with converting from incandescent to fluorescent lamps (including compact fluorescent lamps or CFLs) and solid-state lighting has motivated many national governments to pass regulations that phase out the use of incandescent lights.

CFLs are a candidate for replacement of incandescent light bulbs, but many find their spectrum to be less pleasing than traditional incandescent sources. Compact fluorescent lamps also pose environmental and health risks, e.g., because they contain very toxic mercury vapor. Also, traditional cathode ray tubes and similar devices use electrons to stimulate conventional phosphors, typically transition metal or rare earth compounds. The conventional phosphors limit efficiency because the phosphors must dissipate charge by emitting a photon before accepting additional energy.

Solid state light devices such as light emitting diodes (LEDs) made of semiconductors, and particularly planar devices, are of great interest and have been studied broadly. Such LEDs are also in the process of entering the market. LEDs have the potential to revolutionize the lighting industry with higher efficiency, better quality and lower maintenance, and could to a reduction by half of energy consumed by general illumination.

However, traditional incandescent light sources are favored by many people because they provide a broad spectrum of incoherent light that produces a pleasing white light. A given LED, on the other hand, emits light of a specific color determined by the bandgap of the semiconductor material constituting the LED.

One approach for producing white light is to use multiple LEDs of different colors—e.g., red (R), green (G), and blue (B). Another approach is to use phosphors to transform blue or near-UV light from an LED, e.g., a GaN-based LED, to "pump" a phosphor or mixture of phosphors. The multiple LED approach leads to narrow spectral lines and is limited in practice by the low efficiency of green LEDs. On the other hand, conventional blue LEDs coated with yellow phosphors give a cold white light and are not color tunable.

Further, although conventional LEDs offers intrinsic advantages of high energy conversion efficiency, they have problems in that the thin film based solid stable LEDs suffer from low light extraction efficiency due to total internal reflection (TIR). Internal waveguiding and self-absorption cause heating and reduce the light emission efficiency and device lifetime. Typically, a heat sink is needed for light bulbs with power higher than 60 W, and the overall energy conversion efficiency is about 30-35%. Cost is also an issue for the manufacturing of the LED devices.

Extensive research efforts have been made towards improving light extraction efficiency. Among the different approaches tested, fabricating vertical arrays of one-dimensional semiconductor devices, such as nanowire (NW) and/or pillar LEDs, has been of great interest. NWs, especially, are considered to have an advantage of high light extraction efficiency due to the waveguide effect and photonic crystal effect. Furthermore, nanowires have been demonstrated to serve as a very good lasing cavity, and both optical and electrical driven NW lasers have been reported.

However, NW-based LEDs generally require the formation of window electrodes on their top surfaces for current injection. These top electrodes in NW-based LEDs may block the emitting light and cause ineffective carrier injection into the NWs. The established approach to fabricate such electrodes involves filling the gap between the NWs or pillars with other materials, such as polymers or spin-on glass, and coating with conductive layers.

Moreover, for most of the wide bandgap semiconductors, hole injection into p-type materials has proved problematic. This is mainly due to the low electrical conductivity in p-type materials, which can therefore inhibit the effective hole injection, the electron-hole recombination, and thus the performance of NW-based LEDs.

SUMMARY

An embodiment junctionless light emitting device (J-LED) comprises a field emitter cathode, and a light emitting semiconductor material sandwiched between an ohmic contact (OC) that faces the injected electrons and a Schottky contact (SC). The field emitter cathode is configured to inject electrons into the ohmic contact. Both DC and AC J-LEDs are provided. Junctionless laser diodes (J-LDs) are also provided.

BRIEF DESCRIPTION OF THE DRAWINGS

FIG. 2A shows an energy band alignment, FIG. 2B shows operation under bias, FIG. 2C shows injection of electrons from a cathode into a vertical array of nanowire light emitting materials, FIG. 2D shows a vacuum envelope, and FIG. 2E shows an example light emitting module;

FIG. 3A shows scanning electron microscope (SEM) images of the top and 90 degree angle view (inset) of a vertical ZnO nanowire array, FIG. 3B is an SEM image of the ZnO nanowire array coated with 50 nm Al (floating electrode), FIG. 3C is a large scale SEM image of the anode with an Al back contact grid, and FIG. 3D shows sharp UV emission of cathodoluminescence from ZnO nanowire arrays;

FIG. 4A is an SEM image of CNT arrays on top of a glass substrate using conductive binder, FIG. 4B shows field emission current of the CNT array (inset shows the measurement cathode/anode structure), and FIG. 4C shows linear Fowler-Nordheim plots of the three electron emission current curves;

FIG. 6A shows UV emission from ZnO, FIG. 6B shows light emission in a vacuum chamber, FIG. 6C shows rectifying I-V and light emission intensity vs. voltage (L-V), and FIG. 6D shows the light emission intensity and peak position vs. voltage and power;

FIGS. 7A-7E show a demonstration of impact ionization in an embodiment J-LED, where FIG. 7A shows a module without a floating electrode, FIG. 7B shows an embodiment J-LED module with anode connected to the bottom of ZnO NWs, FIG. 7C shows a comparison of the UV light emission from the two modules in FIGS. 7A-7B, FIG. 7D shows a Monte-Carlo simulation of the electron injection trajectory in the example Al/ZnO structure (thin film ZnO was considered in the simulation), and FIG. 7E shows the energy dispersion of the electron injection in the Al/ZnO structure;

FIG. 10A shows an AC operated J-LED based on CNT and ZnO NWs according to another embodiment.

DETAILED DESCRIPTION

Figure 1A:
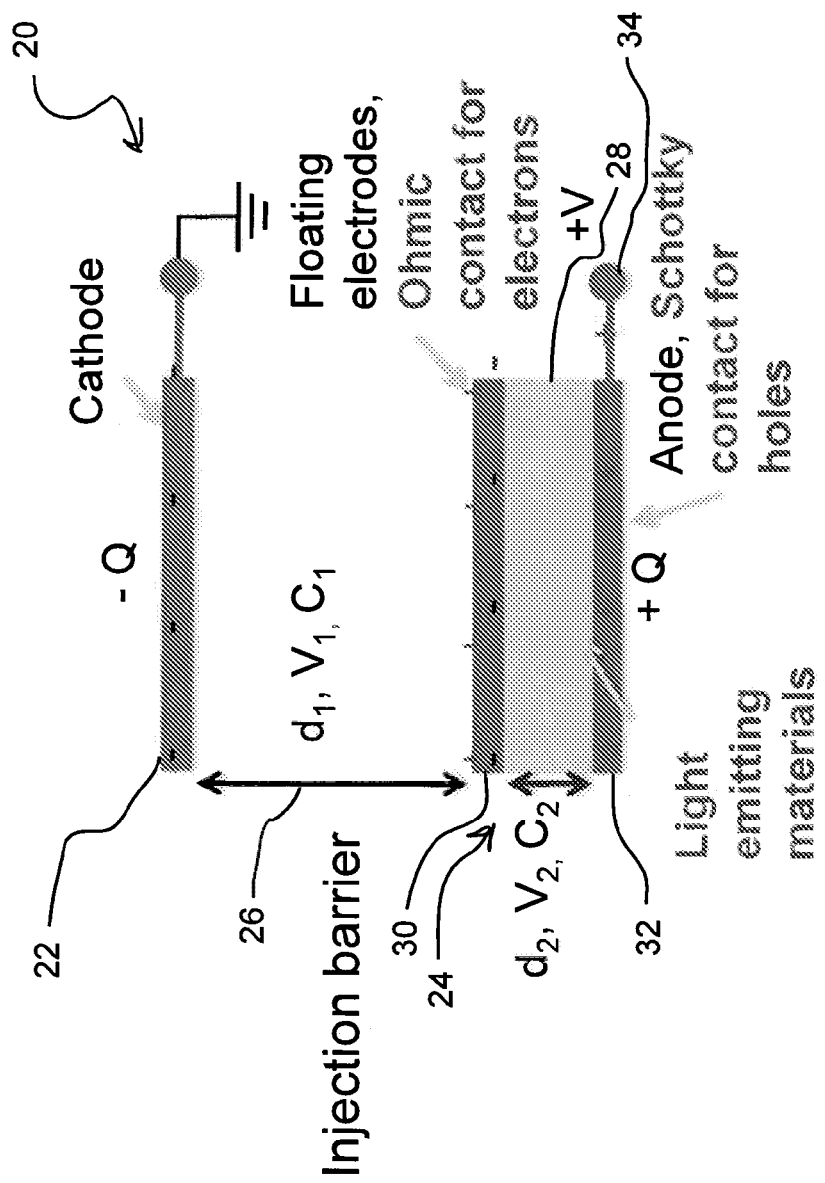
FIG. 1A shows an embodiment junctionless light emitting device (J-LED)

An embodiment semiconductor light emitting device does not require the formation of a physical p/n junction (junctionless). Such a light emitting device is referred to herein as a junctionless light emitting device, or J-LED. An example device is not limited by the need for a physical p/n junction or the constraints of p- or n-doping, thus reducing processing complexity and cost. Instead of a physical phi junction, an embodiment J-LED injects electrons and holes into a semiconductor light emitting material. Example J-LEDs provide novel energy saving light emitting devices.

An embodiment method and device for producing light injects electrons from a field emitter into a light emitting module of light emitting semiconductor material sandwiched between an ohmic contact (OC) and a Schottky contact (SC). Example light emitting semiconductor materials include conducting or semiconducting light emissive materials, such as III-V and II-VI compound semiconductors, oxides, organic and polymeric materials. Light emitting semiconductor materials also include nanomaterials corresponding to the above materials, including nanowires, nanotubes, etc.

A nonlimiting example light emitting semiconductor material is embodied in a thin film or a nano structure, including but not limited to nanowires. An example ohmic contact, which can face the injected electrons, also can act as a protective layer for the light emitting semiconductor material. This helps prevent damage and lengthens the device's useful life. Further, the example ohmic contact acts as a light-enhancing reflector.

In an example embodiment, the light emitting semiconductor material is separated by an injection barrier from the field emitter cathode and disposed such that the "floated" ohmic contact (OC) side receives electrons from the cathode, and the Schottky contact (SC) forms the anode. In an example embodiment lighting device, a vacuum enclosure houses the field emitter, e.g., a field emitter cathode, and the light emitting module, such that the injection barrier is provided by a vacuum. In another example embodiment the injection barrier is a solid state dielectric material, providing a solid state J-LED. In a nonlimiting example embodiment, the light emitting semiconductor material is embodied in zinc oxide (ZnO) nanowires, though many other materials and structures can be used.

With a voltage differential provided across the (SC) anode and (field emitter) cathode (e.g. a few hundreds to a few thousands voltage depending on cathode-anode spacing), a small voltage drop appears between the floating OC and the SC, leading to an electric field across the light emitting semiconductor material. The voltage is small and there is no injection of holes into the light emitting semiconductor material from the anode. The field emitter cathode emits electrons, which are injected into the floating electrode (OC), so that the voltage drop between the floating electrode (OC) and the bottom anode (SC) across the light emitting semiconductor material increases and the Schottky barrier is lowered. Consequently, the holes inject into the light emitting semiconductor material. The electrons are injected from the OC to the light emitting semiconductor material (under electric field) and holes are injected from the SC (also under electric field). The electrons and holes meet and recombine in the light emitting semiconductor material, and emit photons with a certain wavelength depending on the materials used.

Another example embodiment lighting device simultaneously, or sequentially, uses field emission materials and photon emitting materials on both the cathode and the anode side. In this way, the example lighting device can operate under AC, as well as allow color tuning or multiple (e.g., dual/triple) color devices.

Examples will now be discussed with respect to the drawings. The drawings include schematic figures that are not to scale, which will be fully understood by skilled artisans with reference to the accompanying description. Features may be exaggerated for purposes of illustration. From the examples, artisans will recognize additional features and broader aspects.

FIG. 1A shows an embodiment junctionless light emitting device (J-LED), generally indicated at 20. The device 20 includes a cathode 22 separated from a light emitting anode, generally indicated at 24, by an injection barrier 26, such as a gap (providing a vacuum) or a solid material. The cathode 22 emits electrons and thus is also referred to as a field emission cathode or a field emitter. The light emitting anode 24 includes a light emitter embodied in a layer of light emitting (non-doped) semiconducting material 28, which is sandwiched between an ohmic contact (OC) 30 and a Schottky contact (SC) 32. In the example device 20 a floating electrode is provided by the OC 30 for electrons. Further, the Schottky contact (SC) 32 provides an (metal) anode for injecting holes from the anode to the light emitting semiconductor material 28. To provide a voltage differential in a nonlimiting example embodiment, the example anode (SC) 32 is coupled to a voltage 34. The cathode 22 in this nonlimiting example is coupled to ground. Other electrical couplings are contemplated.

Figure 1B:
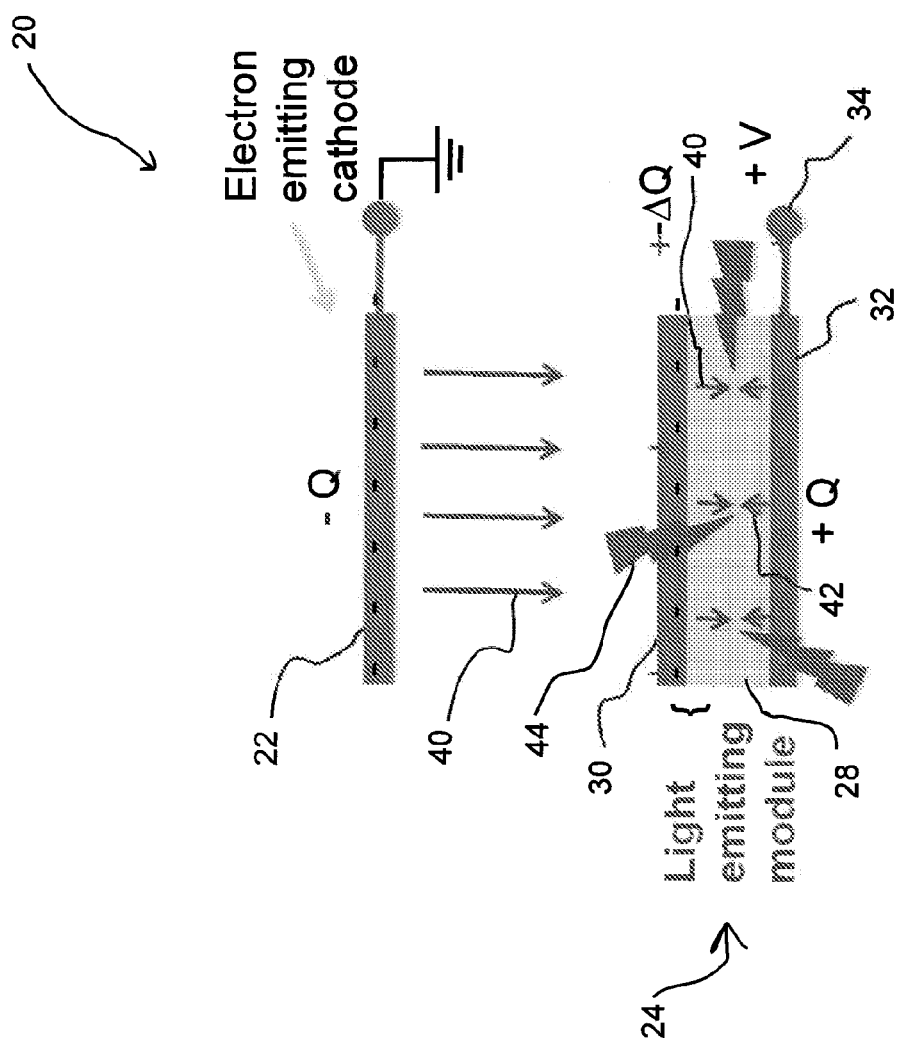
FIG. 1B shows an operation of the J-LED of FIG. 1A.

FIG. 1B shows an example operation of the J-LED 20. With a voltage differential provided across the (SC) anode 32 and field emitter cathode 22, a small voltage drop appears between the floating OC 30 and the SC anode, leading to an electric field across the light emitting semiconductor material 28. The voltage is small and there is no injection of holes into the light emitting semiconductor material 28 from the anode 32. The cathode 22 emits electrons 40, which are injected into the floating electrode (OC) 30, so that the voltage drop between the floating electrode (OC) and the bottom anode (SC) 32 across the light emitting semiconductor material 28 increases and the Schottky barrier is lowered. As a result, holes 42 inject into the light emitting semiconductor material 28. The electrons 40 can include those generated from injection from the cathode 22, as well as secondary electrons generated by high energy electrons if through vacuum, and/or electrons generated by impact ionization.

Thus, the electrons 40 are injected from the OC to the light emitting semiconductor material 28 (under electric field), and the holes 42 are injected from the SC anode 32 (also under electric field). The electrons 40 and the holes 42 meet and recombine in the light emitting semiconductor material 28, and emit photons 44 having a wavelength that depends on the materials used.

In an example embodiment the injection barrier 26 is a vacuum. For example, the module 20 can be encapsulated in a vacuum envelope to provide a vacuum environment (e.g., a high vacuum environment). In another example embodiment, the injection barrier 26 is solid, for instance being formed of very thin dielectrics and tunneling barriers.

In a nonlimiting example embodiment, by providing a vacuum environment and the field emission cathode 22, the electrons 40 gain sufficient energy, and are injected into the (e.g., metal plate) floating electrode (OC) 30 and the light emitting semiconductor material 28. In the light emitting semiconductor material 28, the injected electrons 40 excite electron-hole pairs, which recombine and give cathodoluminescence (CL). In the meantime, the injected electrons 40 on the floating electrode 30 lead to access holes on the anode 32 (capacitor). Under electric field, the electrons 40 on the floating electrode 30 and the holes 42 on the anode 32 are injected into the light emitting semiconductor material 28, wherein they recombine and give electroluminescence (EL). The Schottky contact anode 32 allows the hole 42 injection from the anode to the light emitting semiconductor material 28.

Referring to FIG. 1A, for the device 20 including the floating electrode 30, if one considers two capacitors connected in series, where $V_1$, $d_1$, and $C_1$ are the voltage, distance, and capacitance, respectively, between the field emission cathode 22 and the floating electrode 30, $V_2$, $d_2$, and $C_2$ are the voltage and distance, respectively, between the floating electrode 30 and the SC anode 32, A represents area, $\in_r$ represents the dielectric constant of the semiconductor, and $\in_0$ represents the vacuum permittivity:

$$\Delta V_1 + \Delta V_2 = V$$

$$C = Q/V = \in_r * \in_0 * A/d$$

$$V = Q*d/(\in_r * \in_0 * A)$$

$$\Delta V_1 = Q*d_1/(\in_0 * A)$$

$$\Delta V_2 = Q*d_2/(\in_r * \in_0 * A)$$

$$\Delta V_2/V = (d_2/\in_r)/(d_1 + d_2/\in_r)$$

$$\Delta V_2 \approx V*(d_2/d_1)/\in_r \text{ when } d_2 << d_1$$

For illustration only, in a nonlimiting example embodiment using ZnO nanowires (NWs) as the light emitting semiconductor material 28, V=4 KV, $d_1$=1.2 mm, $d_2$=2 mm, $\in_r$=8.5 for ZnO; average $\in_r$=2 considering the space between NWs: $\Delta V_2 \approx V*(d_2/d_1)/\in_r$=0.8V, and the electric field in ZnO NWs: E=$\Delta V_2/d_2$=4e3 V/cm. This high electric field is sufficient for impact ionization leading to more charge generation in the light emitting semiconductor material 28.

Figure 2A:
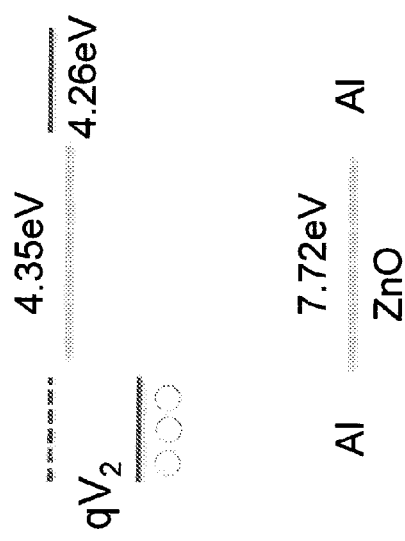
FIGS. 2A-2E show an embodiment J-LED using ZnO for a light emitting semiconductor material, where
Figure 2B:
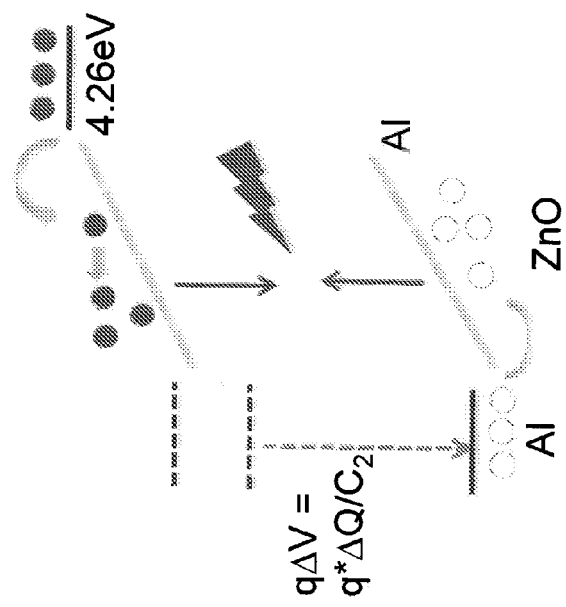
Figure 2C:
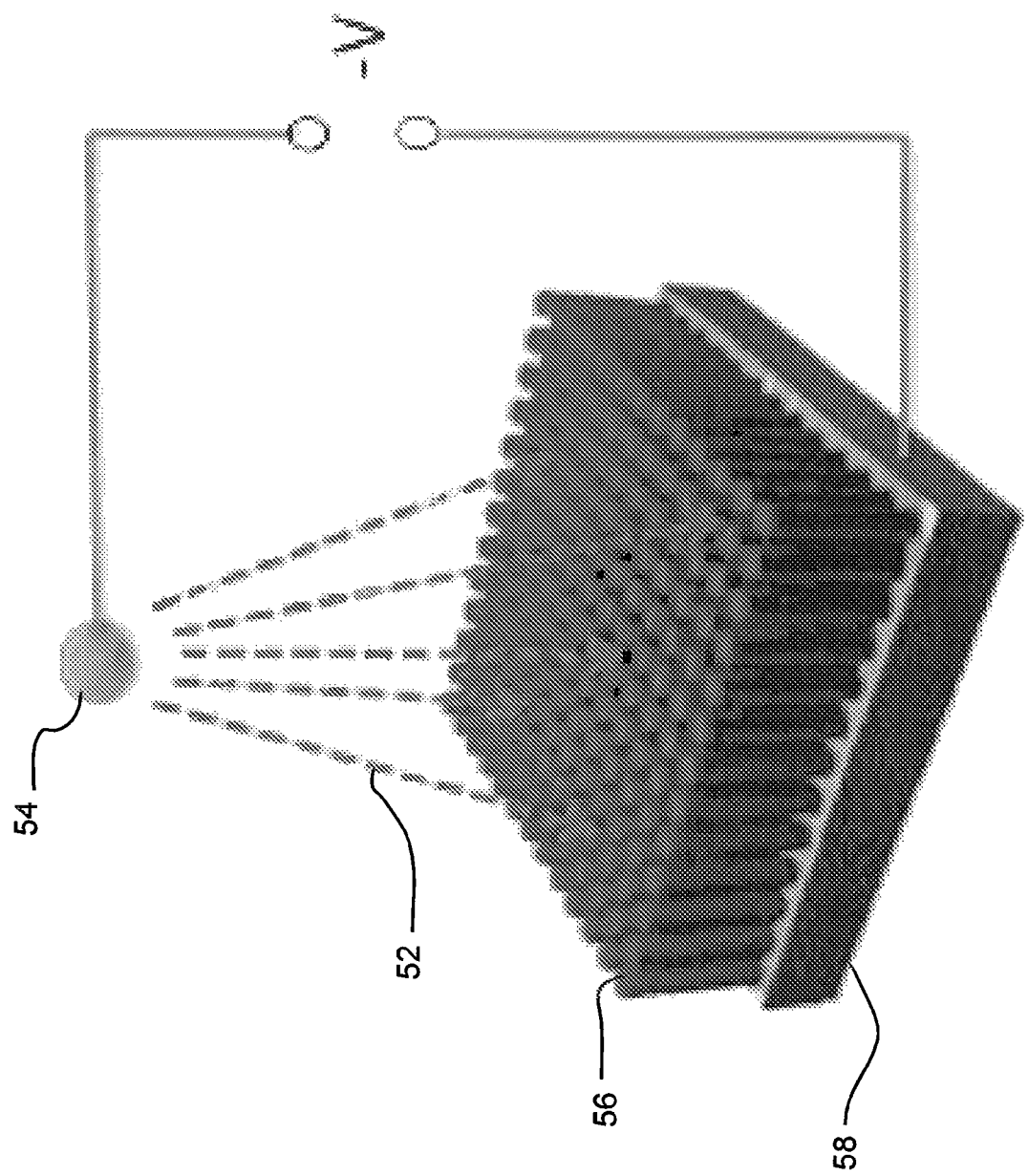

FIG. 2A shows an energy band alignment of an embodiment J-LED using ZnO as the light emitting semiconductor material 28, and with a vacuum injection barrier 26. An embodiment ZnO material is ZnO NWs, though other forms, such as but not limited to thin film, sol-gel, quantum dots (QDs), etc. can be used. The anode (SC) 32 in the example embodiment is aluminum, as is the floating contact 30 (provided by, for instance, coating the NWs with aluminum), and the contact to the cathode 22 is gold. FIG. 2B shows, under bias, impact ionization (generation of electrons and holes) and the injection of holes through the Schottky junction, FIGS. 2A-2B depict the SC anode 32 and the lowering of the injection barrier 26 as the electrons inject into the top plate (floating contact 30). With increase the voltage drops on the ZnO light emitting semiconductor material 28 and allows hole injection into the ZnO material. This consequently leads to the recombination of electron and holes and the EL in ZnO material. FIG. 2C shows an example injection of electrons 52 from a cathode 54 into a vertical array of nanowire light emitting materials 56, disposed on an anode 58. The nanowire light emitting materials 56 offer large light extraction efficiency.

Figure 2D:
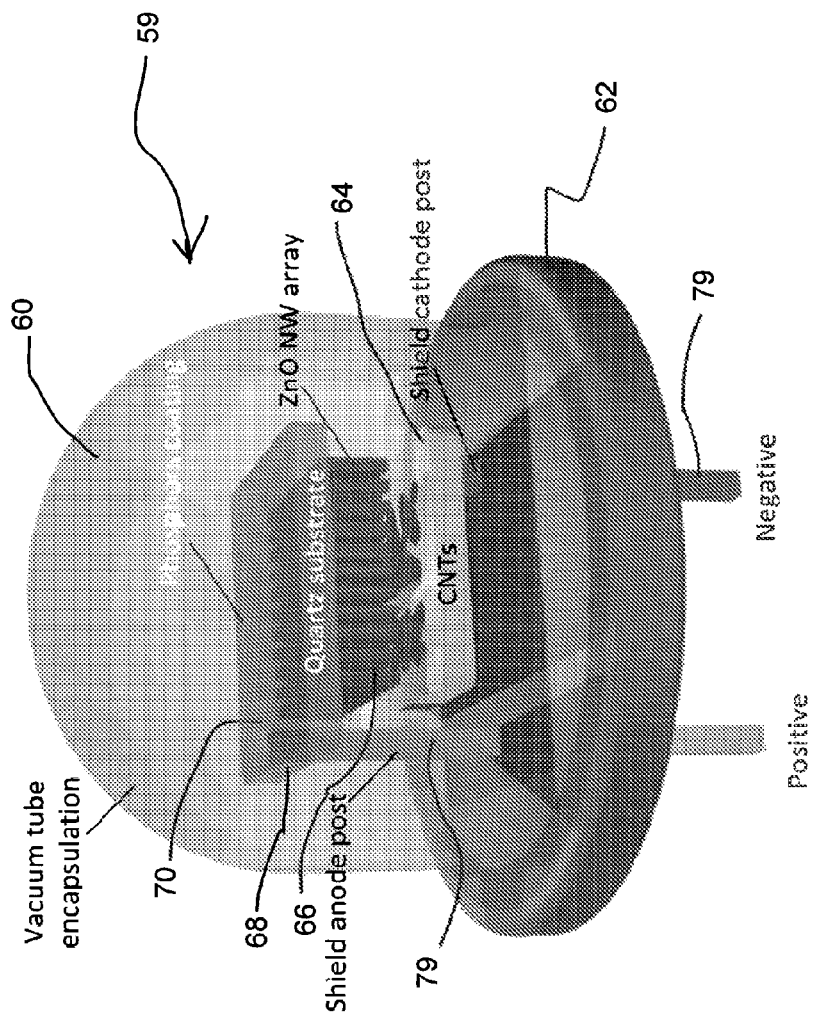

FIG. 2D shows an embodiment vacuum envelope for a J-LED light emitting module, generally indicates as 59, including ZnO nanowires. A vacuum envelope, e.g., a vacuum tube 60 disposed on a stage 62, houses and encapsulates carbon nanotubes (CNT) arrays 64, which provide an electron injection cathode (field emitter), and ZnO nanowire arrays 66, which provide a light emitting semiconductor material. The ZnO nanowire arrays 66 are incorporated into a light-emitting anode, disposed on a quartz anode substrate 68 having a phosphor coating 70.

Figure 2E:
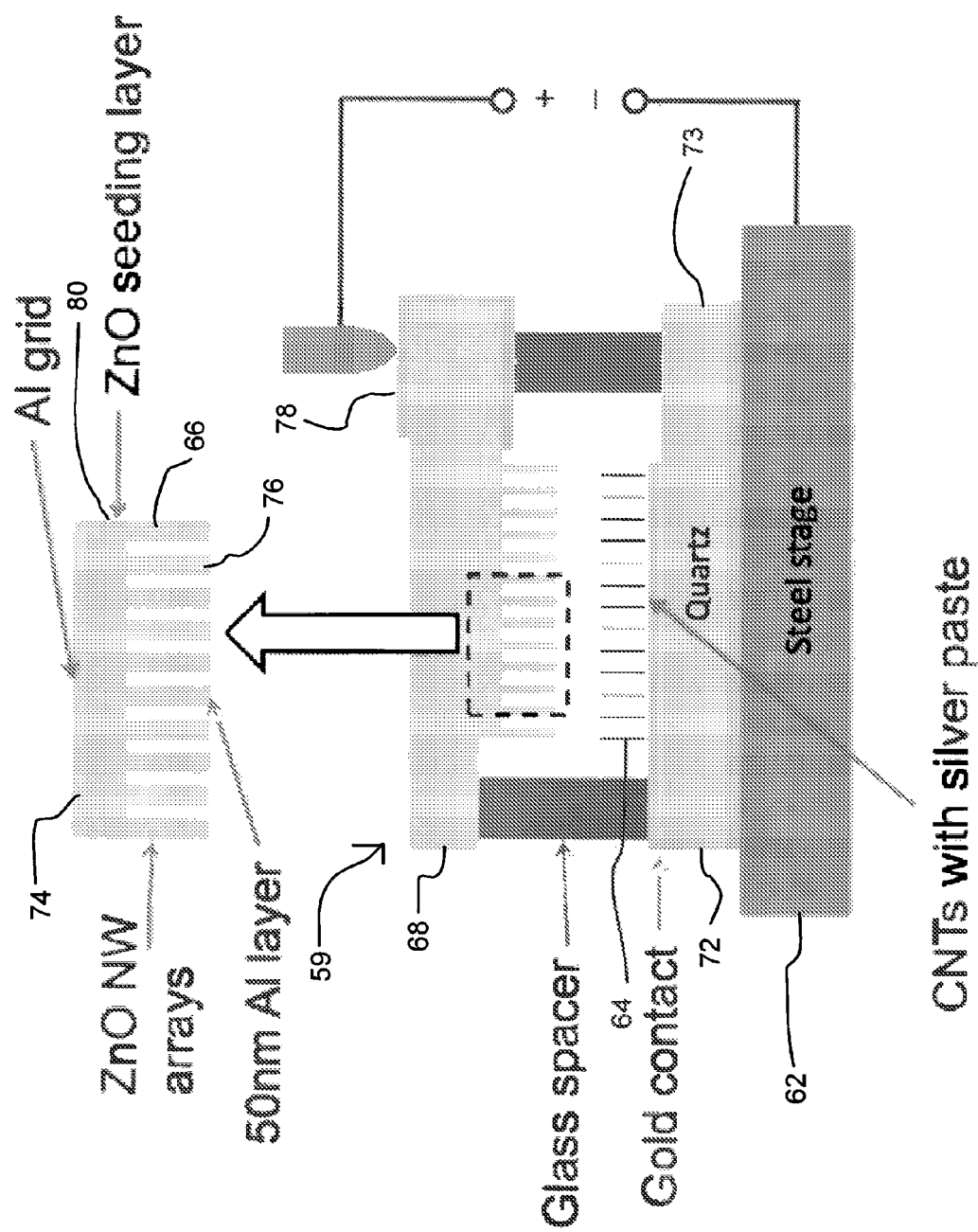

FIG. 2E shows additional features of the example light emitting module 59. A contact 72 to the field emitter cathode (CNT arrays 64) is formed of Au on a quartz cathode substrate 73, and an Al metal back contact grid 74 is provided for the anode (e.g., Schottky contact for hole to ZnO) and a light reflector (e.g., for UV light). A layer of Al thin film 76 on the ZnO NWs provides the floating contact to the light emitting semiconductor material (e.g., OC for electrons to ZnO), so that the light emitting anode includes the Al thin film layer 74, the ZnO nanowire arrays 66, and the floating (Al) contact 76. Another contact 78, to the anode 74, is also formed of Au. Shielded posts 79 (see also FIG. 2D) are provided in the light emitting module 59 for electrically coupling to the contacts 72, 78 for the cathode 64 and the anode 74. The recombination of the injected and generated electrons/holes allows enhanced light emitting efficiency.

In an example method for making the light-emitting anode, the Al grid layer 74 is patterned on quartz by a standard photolithography process. Then, a 50 nm ZnO seeding layer 80 is deposited by low pressure sputtering. To provide the ZnO nanowires using hydrothermal growth a reaction solution, including 25 mM solution of zinc acetate and heximetyltriamine (HMTA) in deionized (DI) water, is prepared. The samples are fixed on supporting glass slides, and then the glass slides are made upside down, and the samples immersed in the reaction solution. The reactor is placed in an oil bath, and the inner temperature is maintained at 85° with agitation at 200 RPM for 2.5 hours. The as-grown samples are rinsed by DI water, blow dried with $N_2$, and then annealed at 350° in $N_2$ for 1 hour. To complete the example light-emitting anode, a 50 nm thick Al layer 76 is deposited on the ZnO NW upper faces by electron beam evaporation.

Figure 3A:
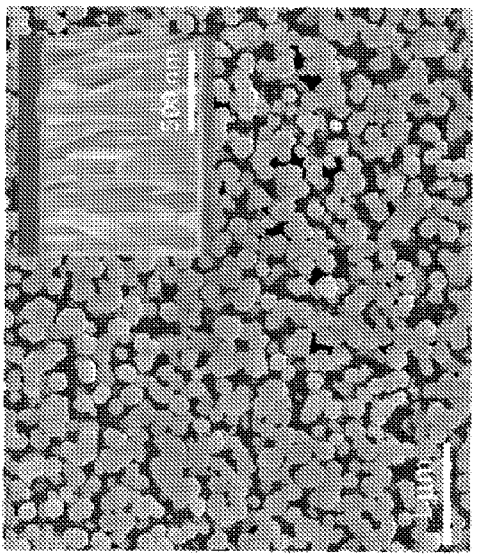
FIGS. 3A-3D show an embodiment ZnO nanowire array light emitting anode, where

FIGS. 3A-3D show an embodiment design of a ZnO nanowire array for a light-emitting anode. FIG. 3A shows SEM images of a top and 90 degree angle view (inset) of a vertical ZnO nanowire array produced from hydrothermal growth. Hydrothermal growth provides high quality NWs, and can provide low manufacturing cost. Additionally, ZnO can have intrinsic electron irradiation sustainability. Quartz plates are used in a nonlimiting example as the cathode and anode substrates 68, 73 because they are UV transparent and have excellent thermal and mechanical properties, though other substrates can be used. Very dense NW arrays are obtained using an example method, as shown in FIG. 3A. The inset demonstrates the side view morphology of ZnO NWs, indicating that the lengths of the example NWs shown are around 1.5 µm to 2 µm.

Figure 3B:
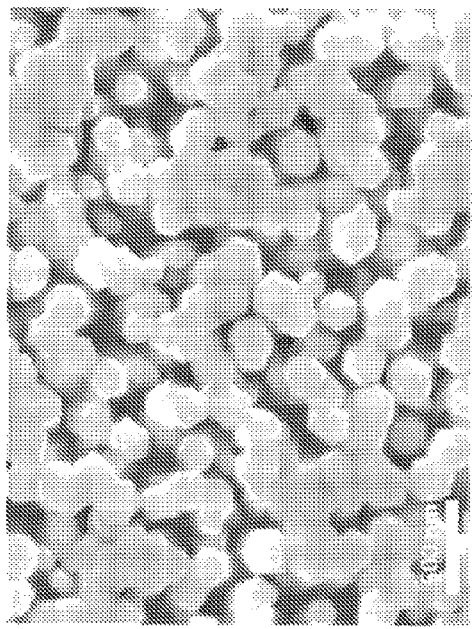
Figure 3C:
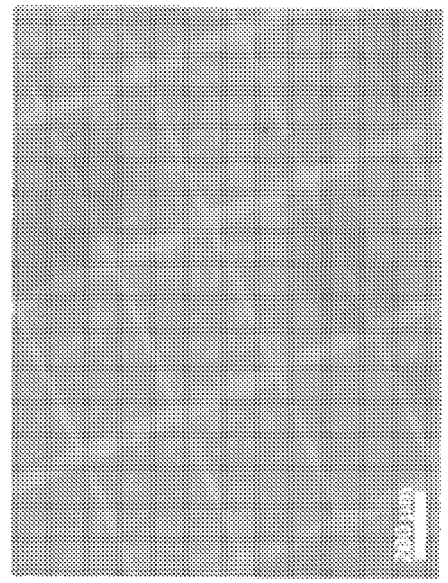

In an example formation method, the Al back contact grid 74 is patterned on a quartz substrate through a standard photolithography process. This example grid structure acts as the bottom electrode, generating an electric field, and further acts as a window layer allowing light emission. Well-aligned ZnO nanowire arrays are then grown by hydrothermal technique. FIG. 3B shows an SEM image of the example ZnO nanowire array, which is coated with 50 nm Al to provide the floating electrode 76. FIG. 3C shows a large scale SEM image of the example anode with the Al back contact grid, which serves both as a UV reflection layer and surface charge dissipation layer.

Figure 3D:
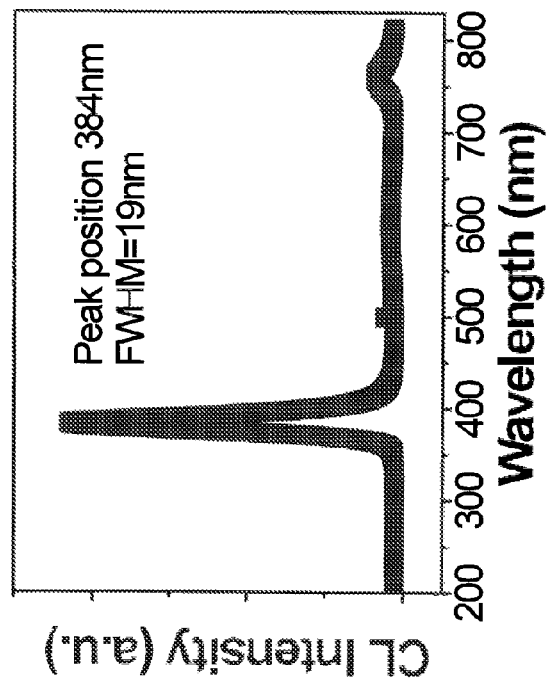

FIG. 3D shows cathodoluminescence (CL) of example ZnO nanowire arrays, which indicates a typical spectrum showing the near band edge emission at 390 nm. The band edge emission is attributed to free-exciton annihilation. This result presents the same trend with the room temperature cathodoluminescence (CL) spectrum. Both of them show a dominant peak in the UV region. Besides the UV emission, room-temperature spectra from ZnO usually exhibit one or more peaks from the defects-related emission in the visible region. The high intensity ratio of UV to the defect emission from example ZnO NWs indicates that the example ZnO NWs have relatively good crystalline quality. However, the sample quality is also dependent on the excitation power as well as the excitation area.

Figure 4A:
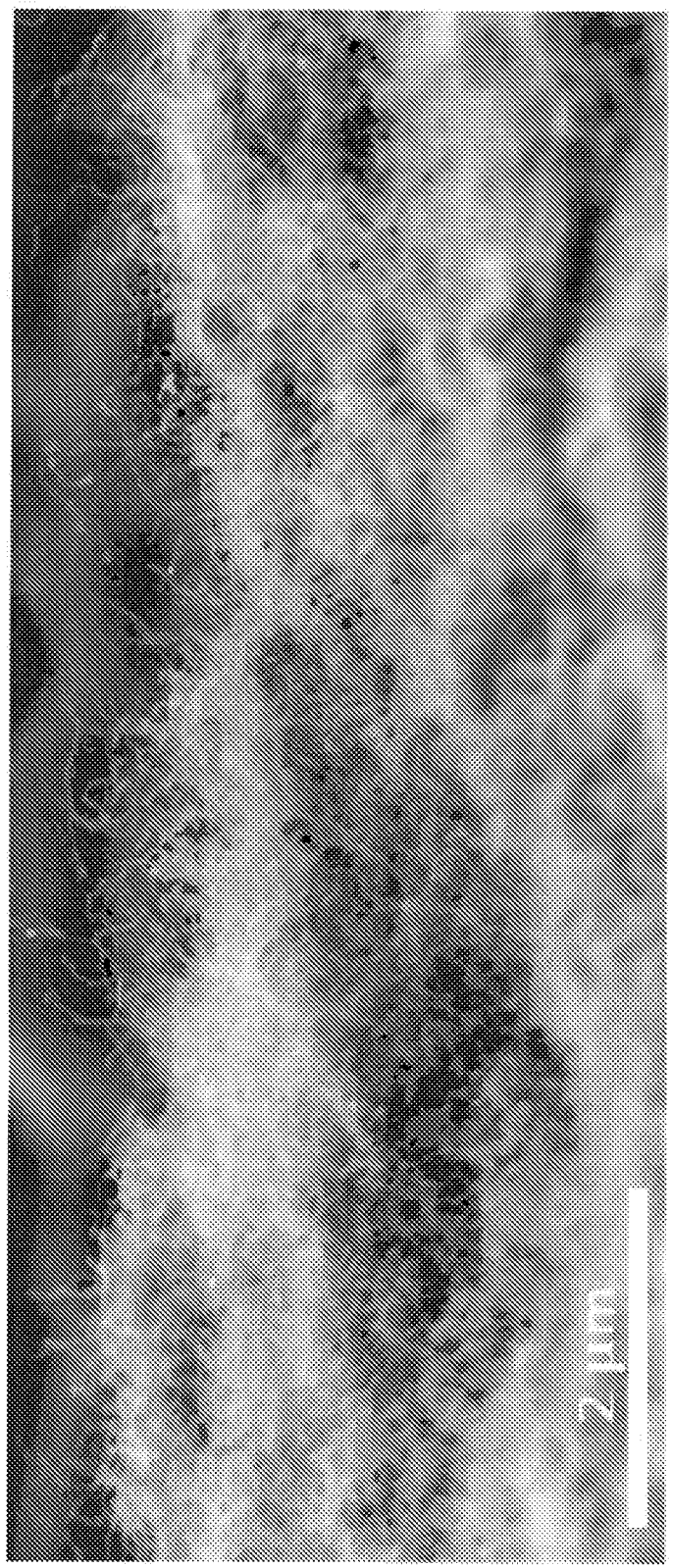
FIGS. 4A-4C show an embodiment electron emission cathode (emitter cathode) using carbon nanotubes (CNTs), where

FIG. 4A shows an example electron emission cathode 64 using CNTs. Electron emission cathodes using CNT arrays can be fabricated in nonlimiting examples by using both electrophoresis and stamping methods. In a particular example fabrication method, a quartz substrate is cleaned by acetone, isopropyl alcohol (IPA), and DI water. A 300 nm thick gold layer is deposited by electron beam evaporation. Then, a thin silver paste layer is applied (e.g., painted) on the gold layer to improve the adhesion of CNTs on the metal contact. 10 g Terpineol (95%), 0.2 g multi-walled nanotubes (MWNTs) (2%) and 0.3 g ethyl cellulose (3%) are mixed to form CNT paste, and ultrasonicated for 30 min. After the CNT paste is painted on the silver paste layer, the entire sample is heated to 90° to remove the solvent. The sample is then sintered at 400° in $N_2$ for 1 hour. Adhesive tape is then applied to pull the CNT tips out of the paste.

Figure 4B:
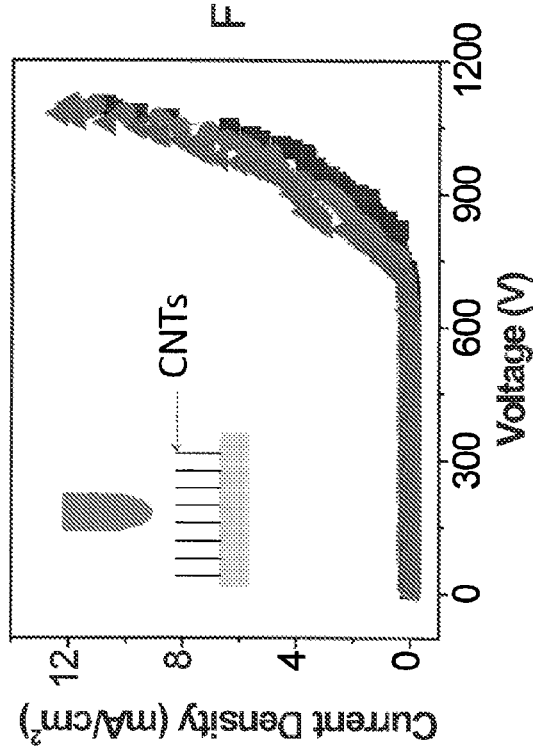
Figure 4C:
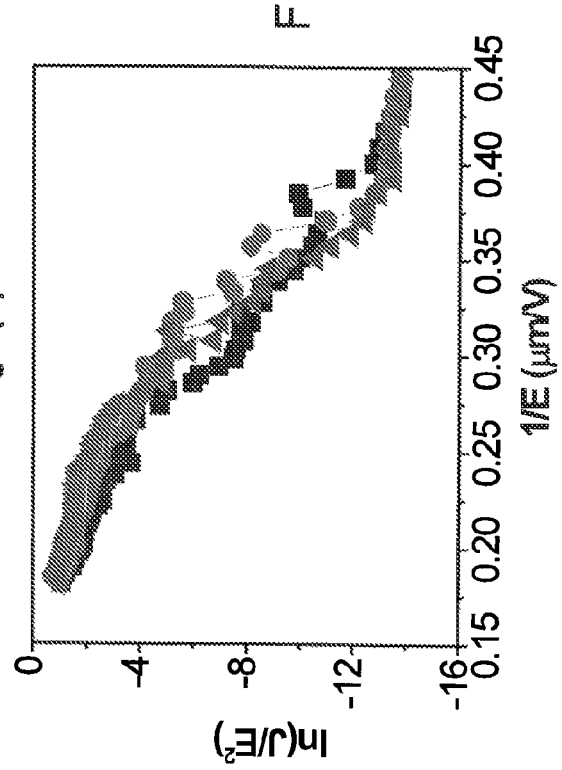

FIG. 4A show the SEM image of example CNT arrays on top of a glass substrate using conductive binder. The SEM image in FIG. 4A shows many protruding CNT tips. Each tip is an effective electron emission site. FIG. 4B shows a field emission current of the example CNT array (the inset shows the measurement cathode/anode structure). Field emission turns on at the electric field of around 2 V/micrometer. FIG. 4C shows the linear Fowler-Nordheim plots of the three electron emission current curves.

Figure 5:
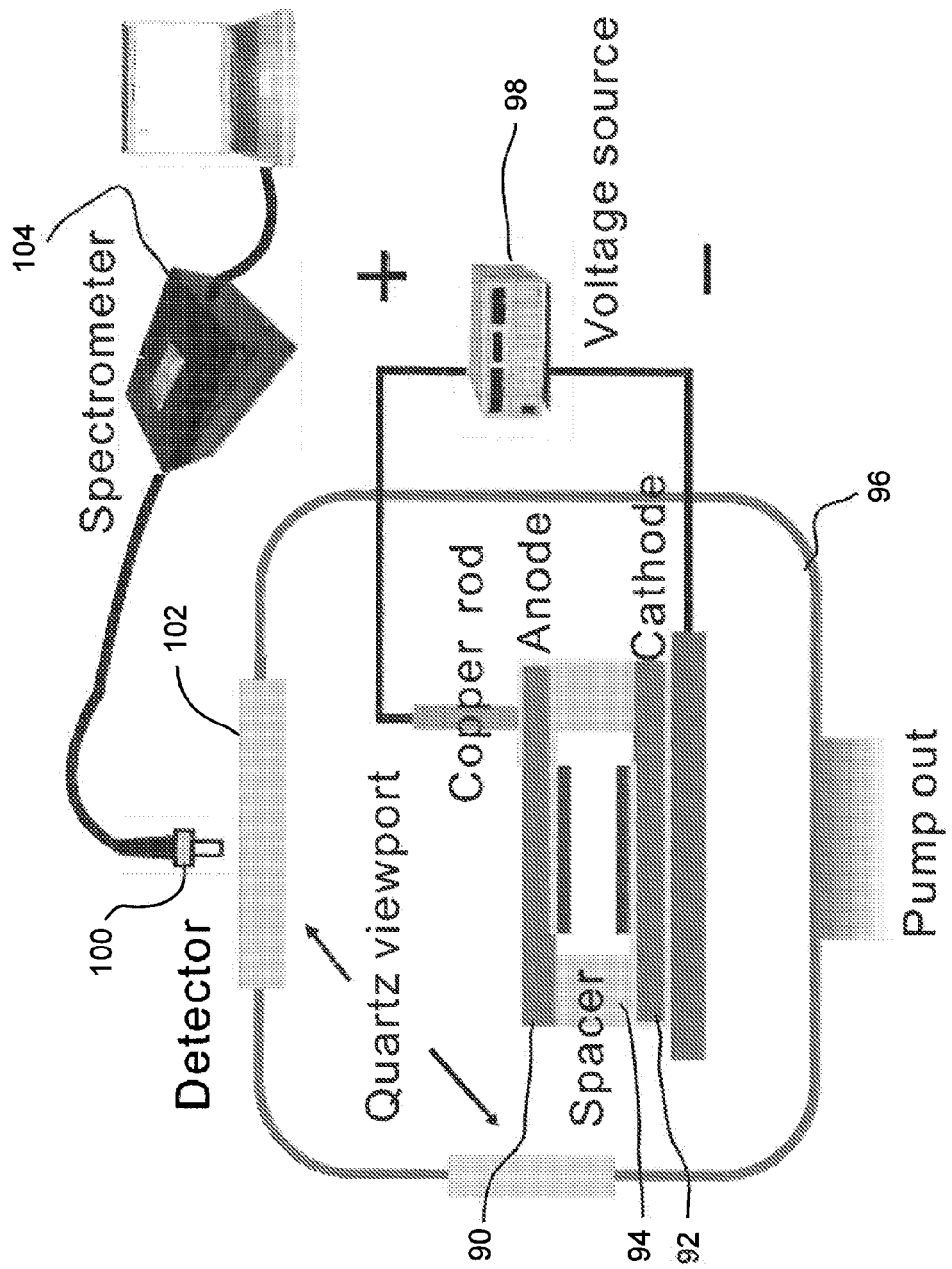
FIG. 5 shows a light emission experimental setup for an example embodiment measuring optical and electrical characteristics for an example electron emission cathode using CNTs.

FIG. 5 shows an example experiment setup performed to measure optical and electrical measurement and to calculate the emission intensity. A cathode 90 and anode 92 were assembled together using two parallel glass slides 94 with thickness of 1 mm spacers, and loaded into a vacuum chamber 96. To achieve a stable electron emission, the typical voltage-current data were recorded after several voltage sweeps up to 5 kV. A high voltage source 98 integrated with a current meter (maximum current of 2 mA, resolution of 0.01 mA) was employed to manually apply the voltage and record the corresponding current. The light was collected by an optical fiber 100, which was vertically put onto the top surface of quartz viewport 102. The emission spectra were recorded by the StellarNet EPP2000 fiber optic spectrometer 104 with spectral measurement ranges from 190-2200 nm and resolution of 0.5 nm. The emission intensities under different anode voltages were obtained by integrating the area under the corresponding emission peak.

Figure 6A:
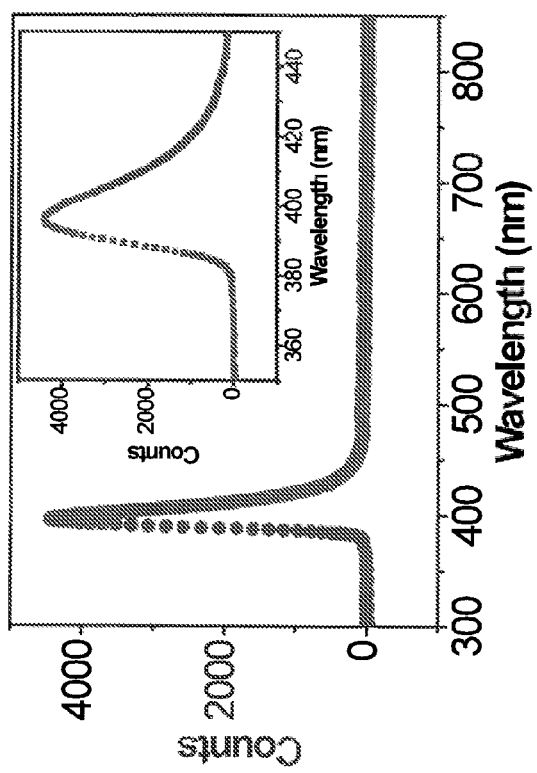
FIGS. 6A-6D show light emission from an embodiment UV nanowire J-LED using ZnO nanowires, where
Figure 6B:
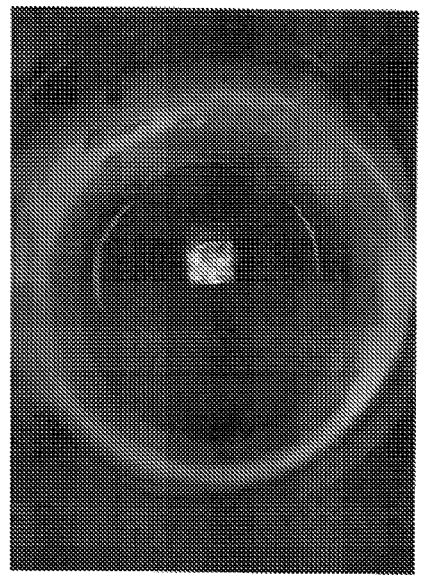
Figure 6C:
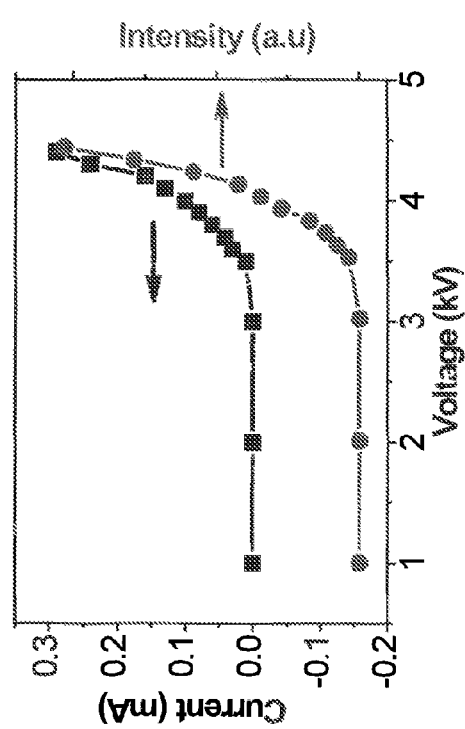
Figure 6D:
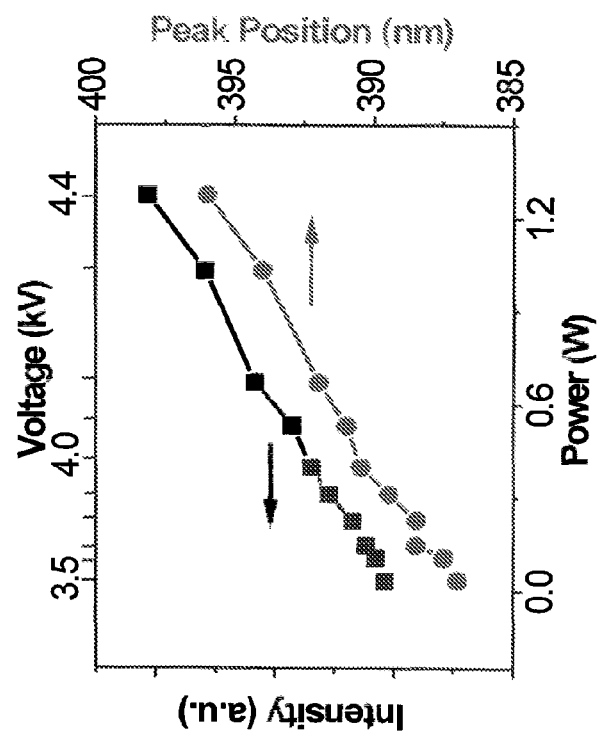

FIGS. 6A-6D illustrate light emission from an example UV nanowire J-LED using ZnO nanowires. FIG. 6A shows a sharp UV emission from ZnO. FIG. 6B shows light emission in the vacuum chamber 96 (including lights of the device and reflection from the inner sidewall of the vacuum chamber). FIG. 6C shows rectifying I-V and light emission intensity vs. voltage (L-V) plots. FIG. 6D shows light emission intensity and peak position vs. voltage and power. The linear relationship indicates a dimmable nature. Above the torn-on voltage, the current and light intensity both increase linearly with the voltage, showing standard rectifying behaviors, which allows the example NW J-LED to be completely dimmable. Though a red-shift of the emission peaks occurred when the power increased, this could be attributed to the heating of light emission materials caused by the high energy electron and lattice interaction.

Figure 7C:
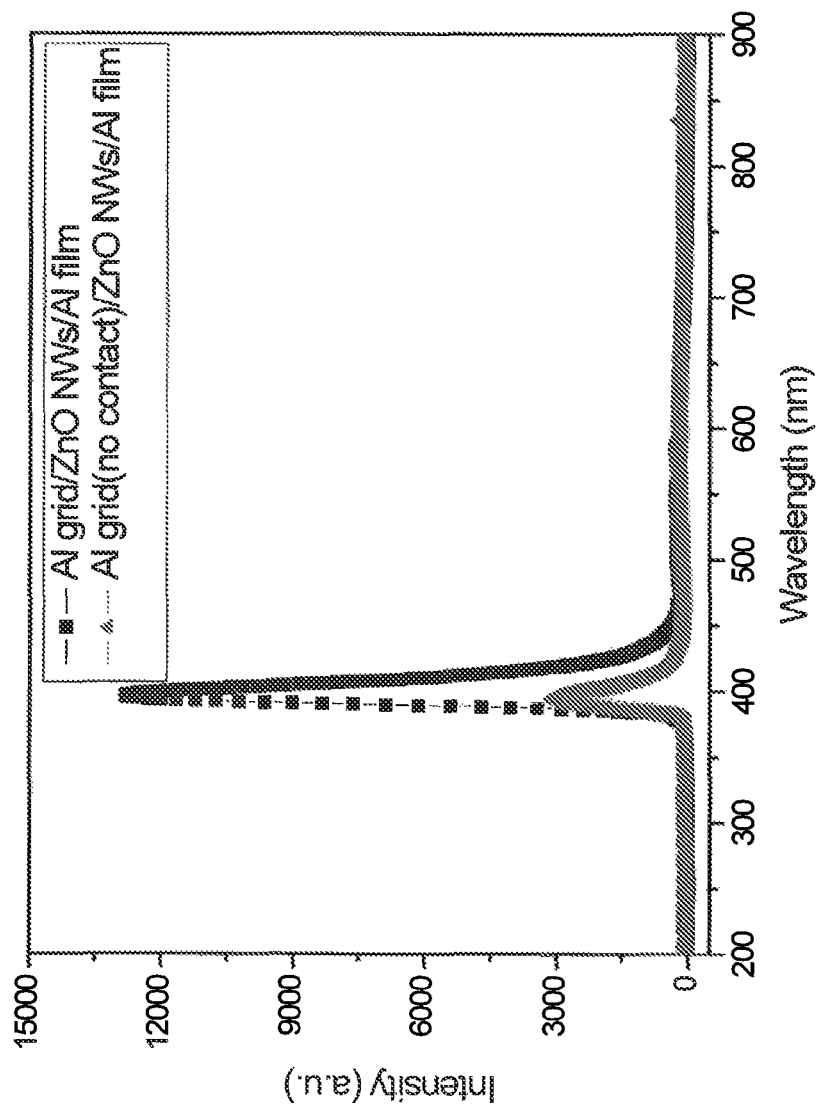
Figure 7D:
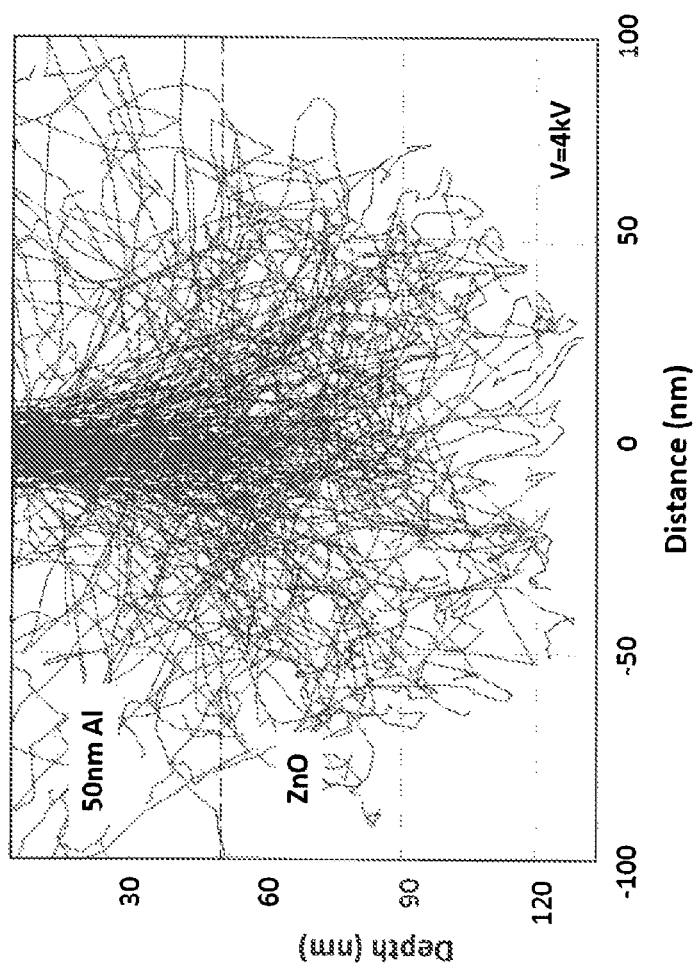
Figure 7E:
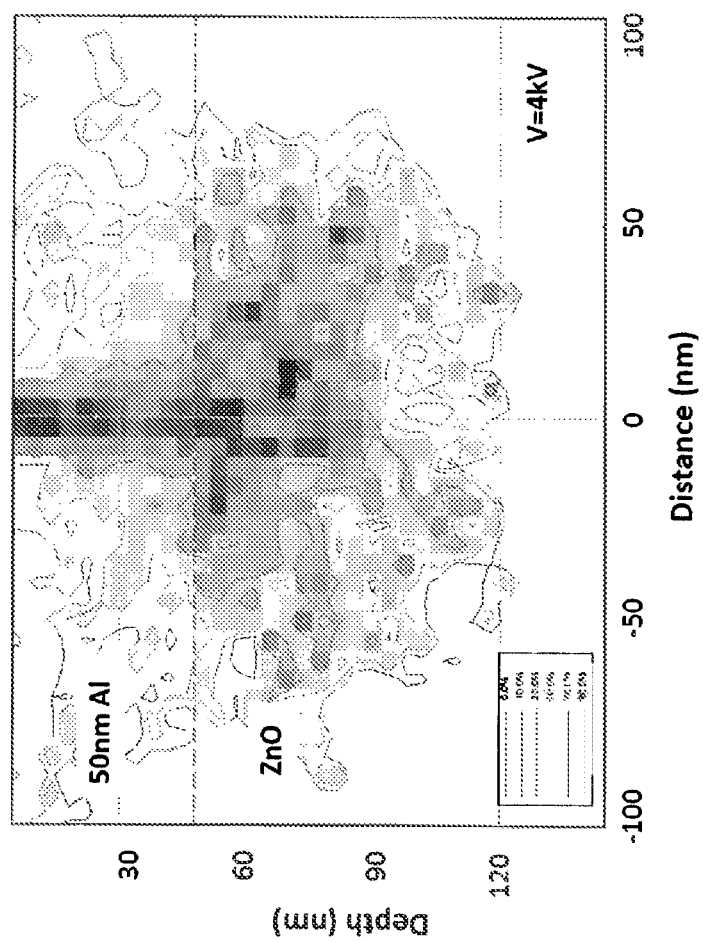

FIGS. 7A-7B illustrate the impact ionization in an example J-LED. FIG. 7A shows an example module 110 without a floating electrode, in which an anode is directly connected to a top Al electrode 114 on the top of ZnO NWs 116. In the module 110, only CL will be obtained. FIG. 7B shows the design of an example J-LED module 120 with an anode connected to the bottom of ZnO NWs 124. In the module 120, both CL and EL are possible. FIG. 7C shows the comparison of the UV light emission from the modules 110, 120 in A and B, where the example J-LED module 120 showed more than 3 times more light emission. FIG. 7D shows a Monte-Carlo simulation of the electron injection trajectory in the Al/ZnO structure (thin film ZnO was considered in the simulation), and FIG. 7E shows energy dispersion of the electron injection in such a structure.

Figure 8A:
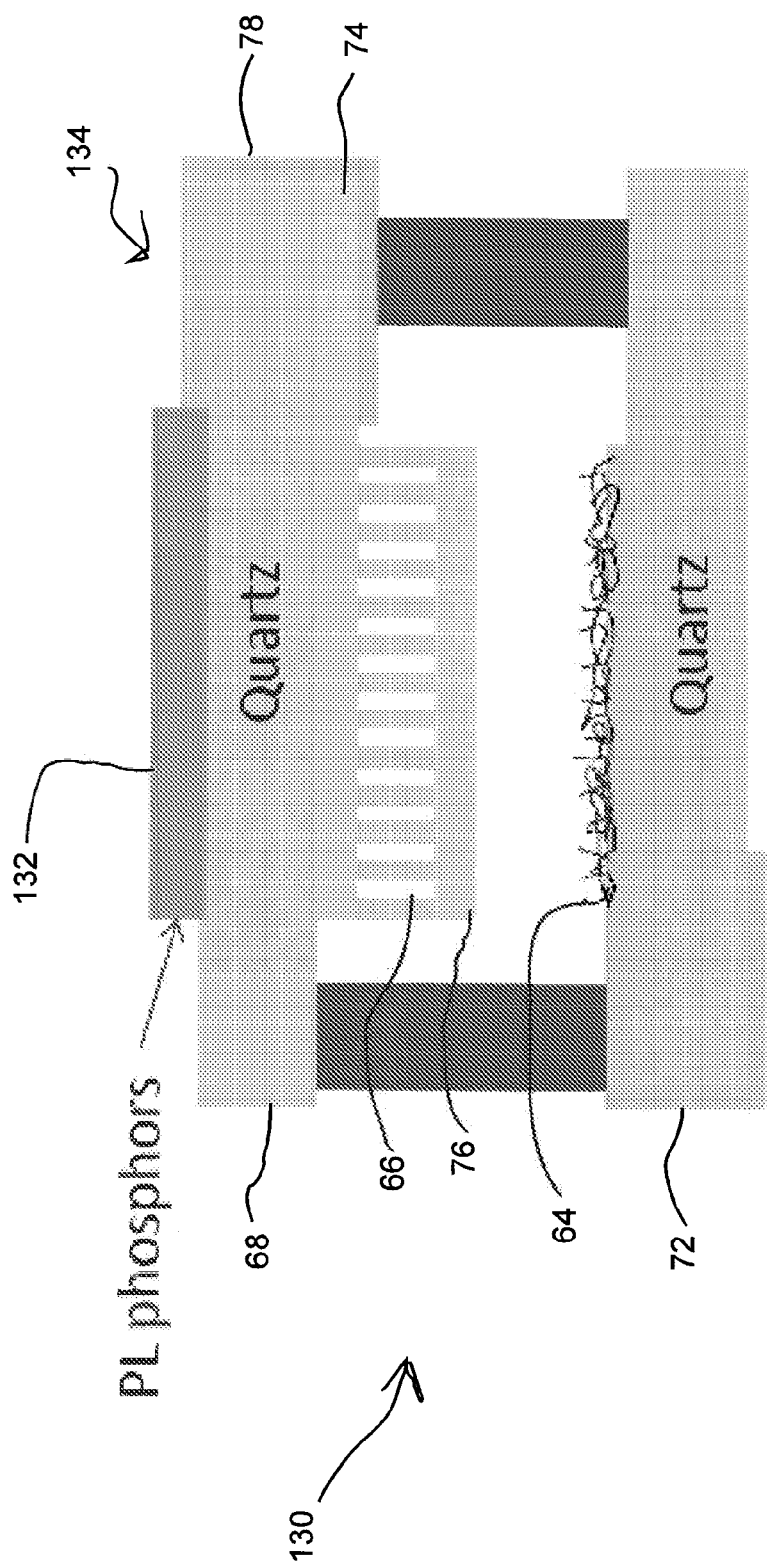
FIG. 8A shows an embodiment in which photoluminescence (PL) phosphors are applied to the back of an anode (sapphire as substrate)
Figure 8B:
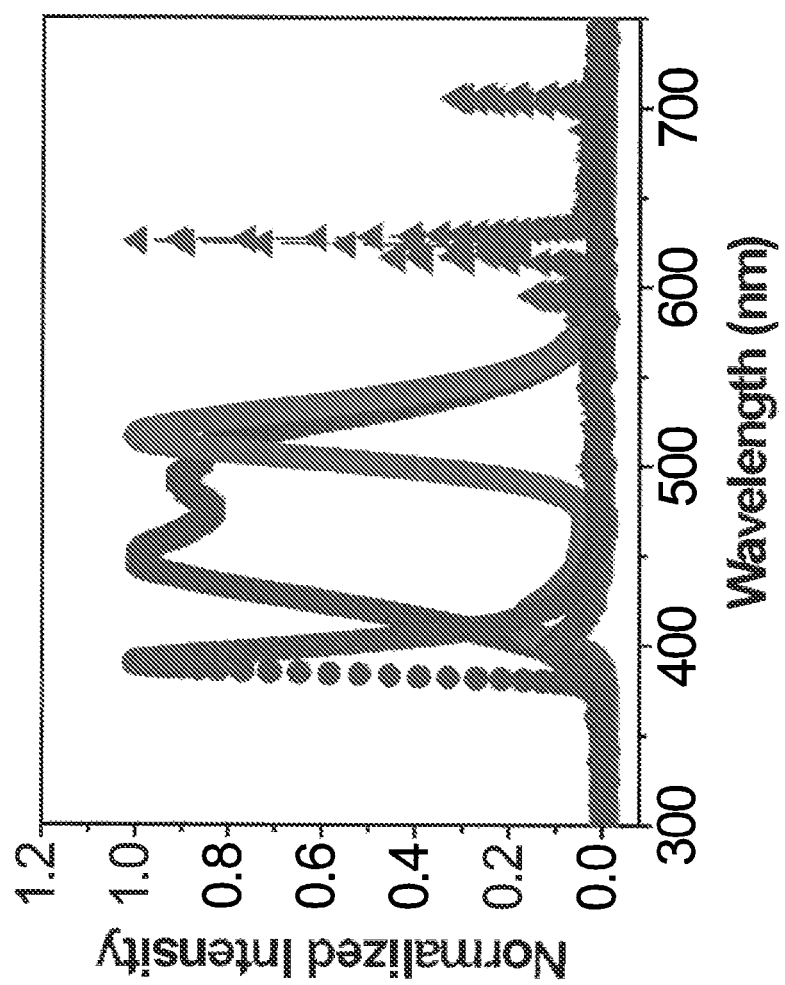
FIGS. 8B and 8C show color tuning and RGB emission from phosphors.
Figure 8C:
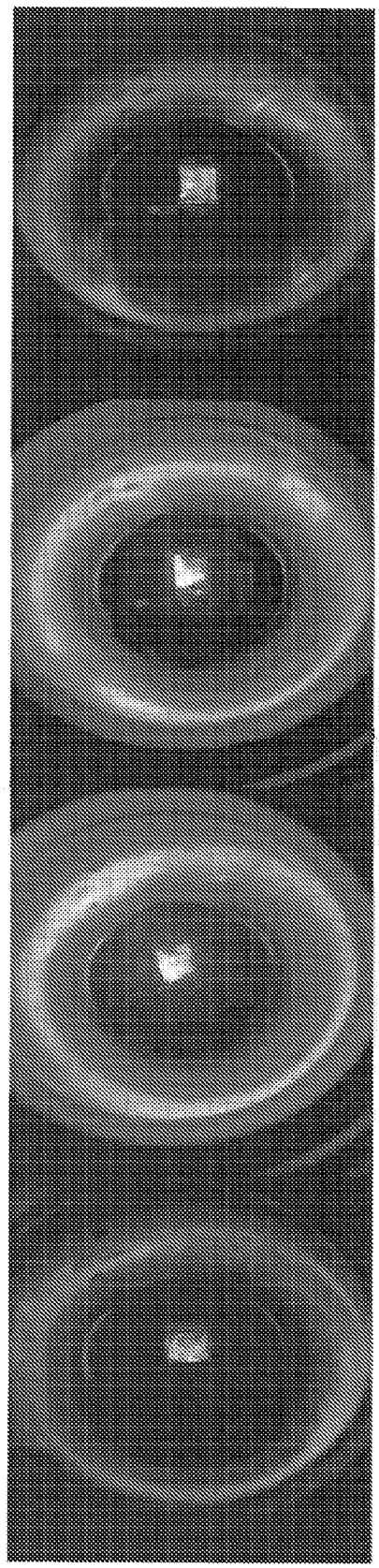

In an example embodiment J-LED, by coating the backside of the anode with different photoluminescence (PL) phosphors, UV light from the light emitting semiconductor materials (e.g., ZnO NWs) can excite those phosphors, thus generating different colors. FIG. 8A shows an example method for tailoring color of a J-LED device 130 with PL phosphors 132, where the PL phosphors are applied to the back of an anode module 134. The example anode module 134 includes a sapphire substrate. FIGS. 8B and 8C show example color tuning and RGB emission from phosphors.

In another embodiment, color tuning can be accomplished by directly using RGB nanowires. Alternatively or additionally, color mixing and white can be accomplished by mixing the RGB phosphor and NWs. The normalized spectra and the corresponding photographs of phosphor-coated samples are shown in FIG. 8B. Example PL phosphors are those used for fluorescent lamps. However, compared to fluorescent lamps, which require small amount of toxic mercury vapor to generate UV and excite phosphors, an example J-LED does not need such mercury vapor. White light can be achieved using a mixture of RGB phosphor with correct ratio or by directly using an array of RGB nanowires.

Figure 9B:
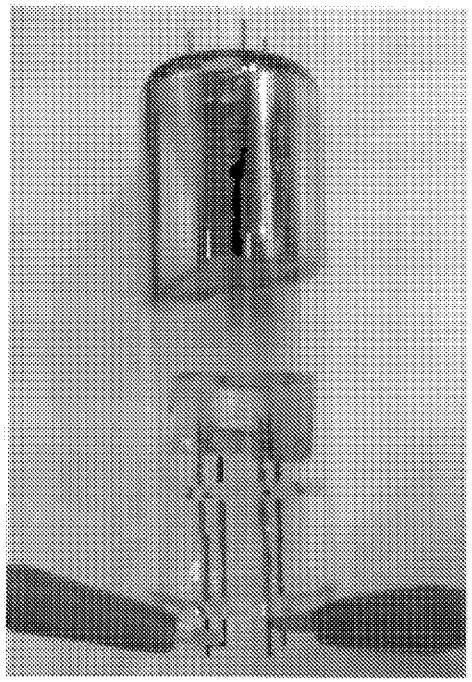
FIG. 9B shows blue emission of the J-LED device of FIG. 9A.
Figure 9C:
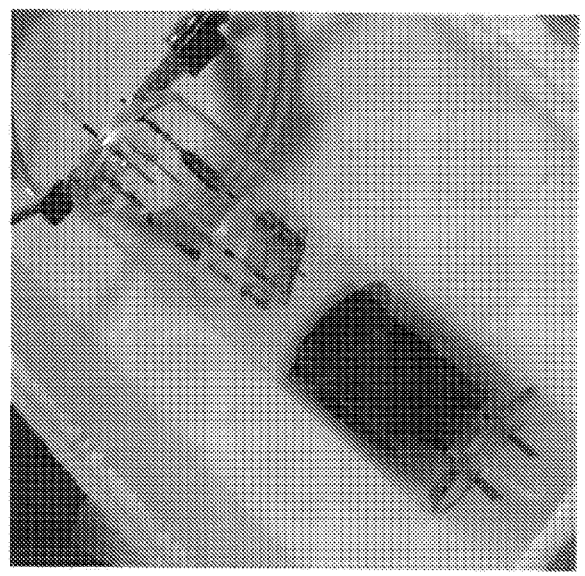
FIG. 9C shows green emission.
Figure 9A:
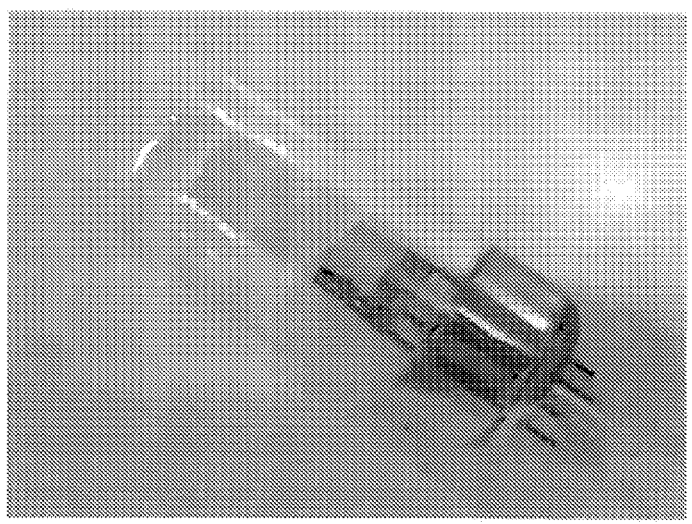
FIG. 9A shows an embodiment J-LED device.

FIGS. 9A-9C show three example J-LED devices according to FIG. 2D, illustrating an example operation. The example device in FIG. 9A is off, the example device in FIG. 9B shows that the J-LED emits blue and the example device in FIG. 9C shows that the J-LED emits green. These example devices were tested under 3-4 kV, which showed an example current at around 0.1-0.3 mA. Uniform emission of blue and green was demonstrated. The example light emission intensity was at around 30-50 lumen, indicting the estimated efficacy of 10-150 lm/W. Brightness of >900 lm at 9 W is possible.

In the example J-LED devices 20, 59, 130, the field emitter cathode and the light emitting anode are face-to-face, with (for example) CNTs being disposed on the cathode, and (for example) ZnO NWs being disposed on the anode, the cathode and anode generating electrons and photons respectively. In this example arrangement, a direct current (DC) signal can be used, and light emission occurs on one side.

In another embodiment, CNTs and ZnO NWs are disposed on both electrodes to allow AC to be used and to permit light emission on both sides. In a nonlimiting example fabrication method, ZnO NWs are grown on an Al grid, and then topped with a 50 nm Al layer. Then, CNTs are sprayed on the samples, and an additional 10 nm Al layer is deposited by electron beam evaporation, to hold the CNTs on the ZnO NWs. The electron field emission from CNTs has been considered to be instant, and the electron flight time between two electrodes is much smaller than the general power supply frequency, which is typically 50 Hz to 60 Hz (0.02 s).

FIG. 10A shows an embodiment AC operated J-LED 150 including CNT 152 and ZnO NWs 154, where CNTs are applied on ZnO NWs disposed between an ohmic contact (not shown) and a Schottky contact (not shown) for first and second substrates 156 and 158, providing both two electrodes emit elections and photons. In this way, the CNT field emitter cathode 152 disposed on the first substrate 156 can inject electrons into the ohmic contact disposed on the second substrate 158. Similarly, in the reverse direction, the CNT field emitter cathode 152 disposed on the second substrate 158 can inject electrons into the ohmic contact disposed on the first substrate 156. This configuration offers additional freedom for an example AC operated J-LED, including mixed colors or multiple color emission from the same device.

Figure 10B:
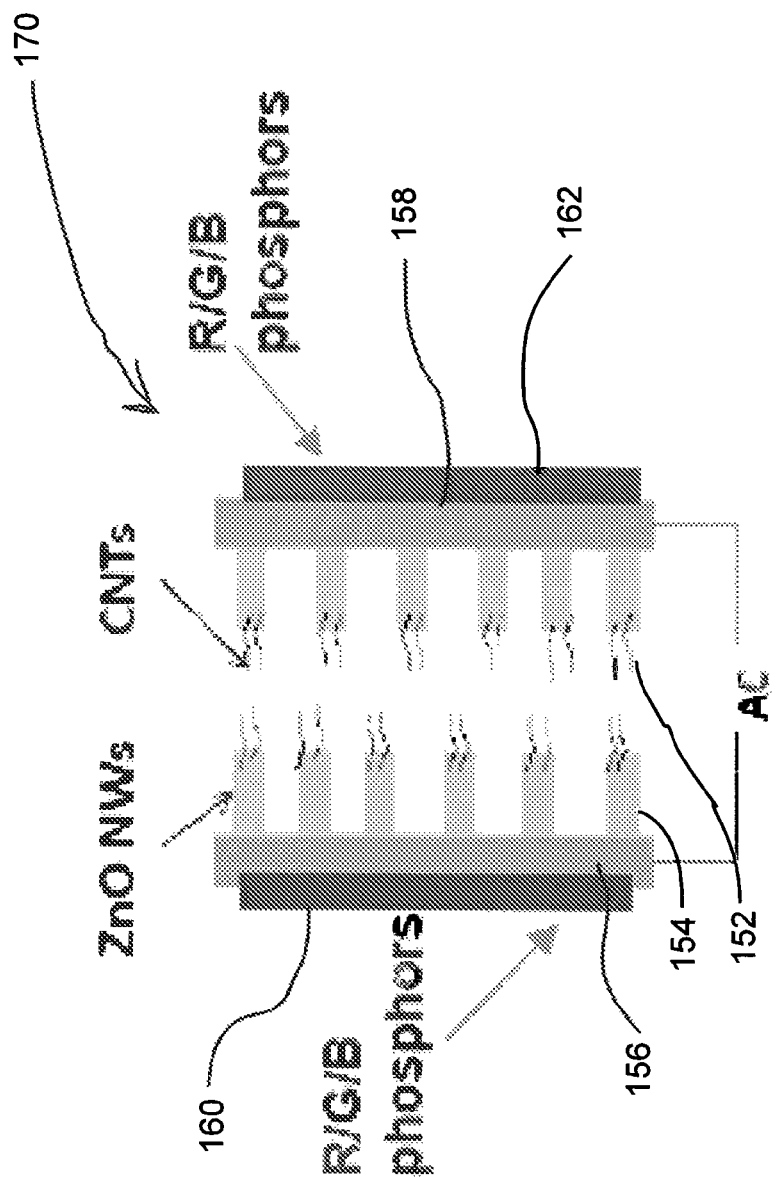
FIG. 10B shows an example method for applying phosphors at the back of the electrodes.
Figure 10C:
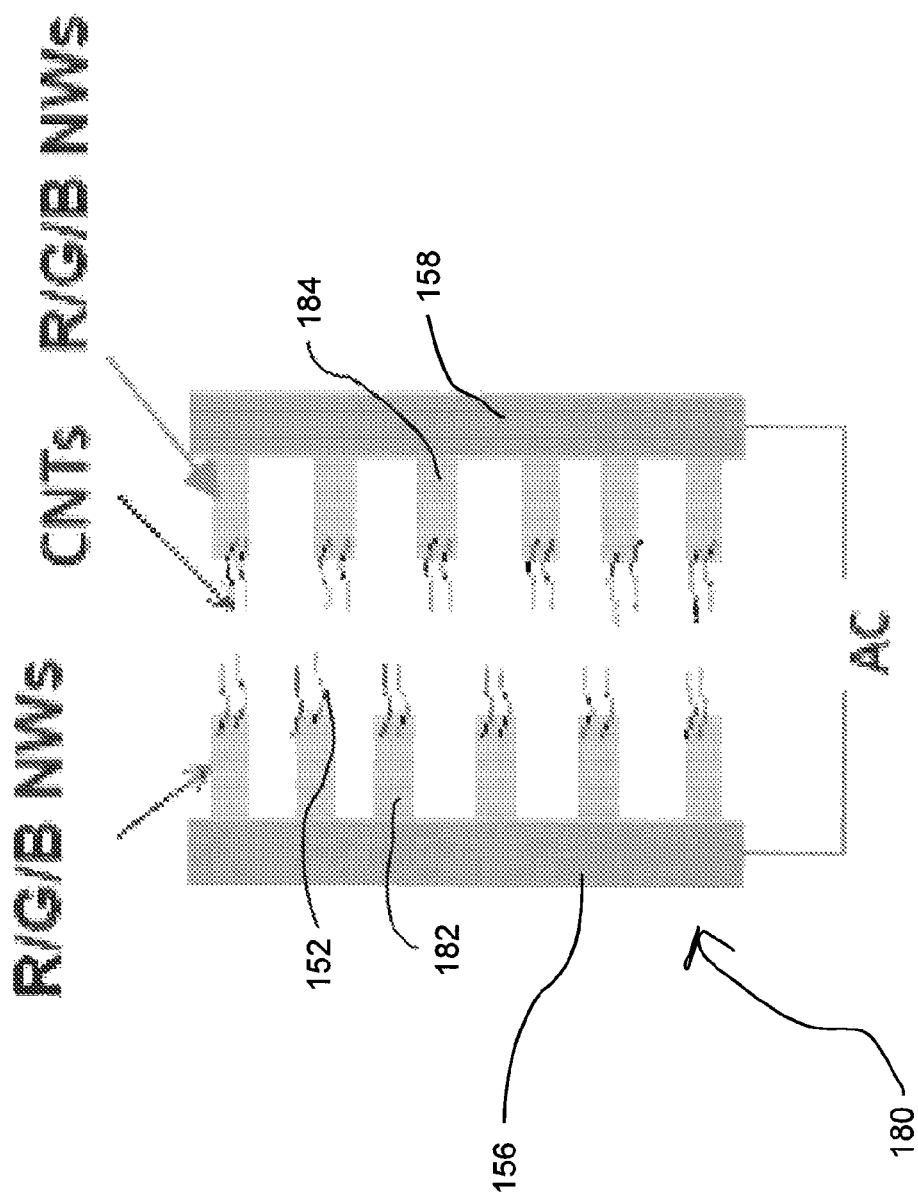
FIG. 10C shows a J-LED with different color emitting NWs, which emits different colors under forward DC, reverse DC, and AC biasing.
Figure 10E:
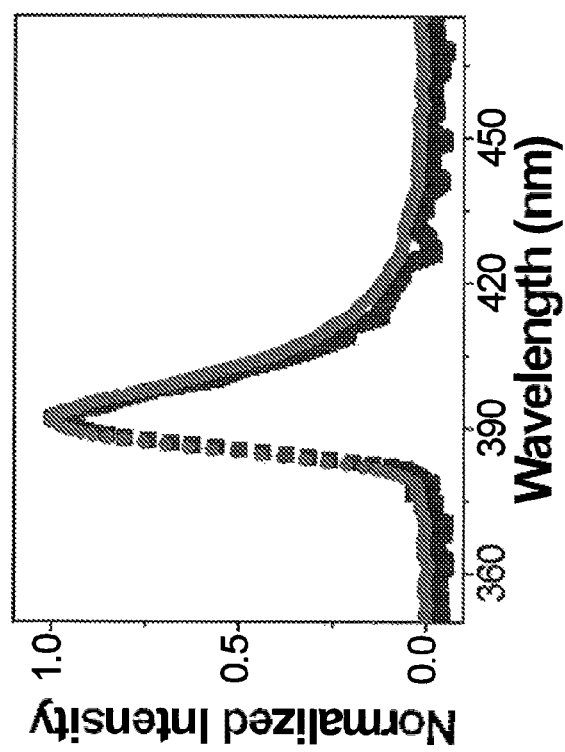
FIGS. 10D and 10E show rectifying I-V characteristics and UV emission under both biasing directions.
Figure 10D:
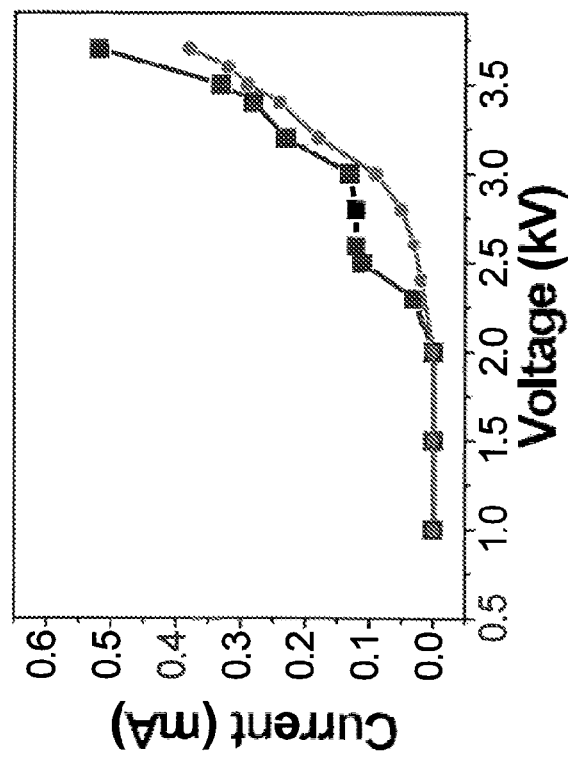

For example, by coating different phosphors 160, 162 on the two electrodes 156, 158, as shown in an AC-operated J-LED device 170 of FIG. 10B, one can easily mix different colors and obtain new ones. FIG. 10B shows an example of applying the phosphors 160, 162 at the back of the electrodes 156, 158, which allows different colors under forward DC, reverse DC, and AC biasing. However, it will be appreciated that the phosphors 160, 162 can be the same or different, and can be selected to provide various color combinations. The said phosphors include unlimited examples, such as complex oxides, quantum dots, nanowires or nanotubes, dyes, organic polymers, etc. FIG. 10C shows an AC operated J-LED 180 with different color emitting NWs 182, 184, which emits different colors under forward DC, reverse DC, and AC biasing. FIGS. 10D and 10E show example rectifying I-V characteristics and UV emission, respectively, under both biasing directions. The two emission peaks from both example electrodes 156, 158 overlap at 392 nm.

Figure 11A:
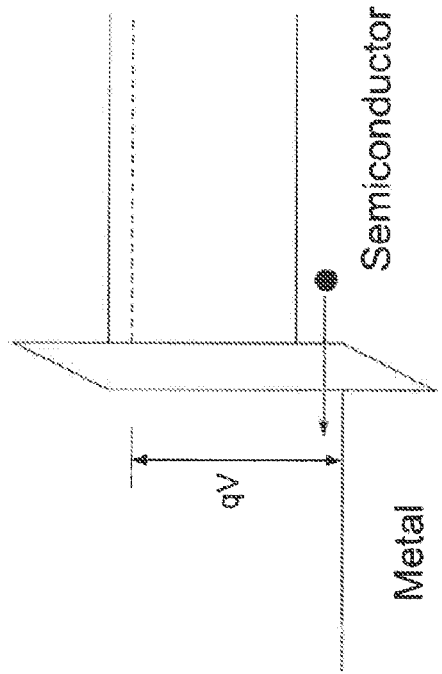
FIG. 11A shows the tunneling barriers at a MIS junction for a solid state J-LED according to another embodiment.

According to another embodiment, by providing a solid state dielectric, instead of (for instance) vacuum, as the injection barrier layer 26, a solid state version of a J-LED can be constructed. FIG. 11A shows the tunneling barriers at a metal-insulator-semiconductor (MIS) junction for an example solid state J-LED, in which electrons tunnel to the semiconductor valance band.

Figure 11B:
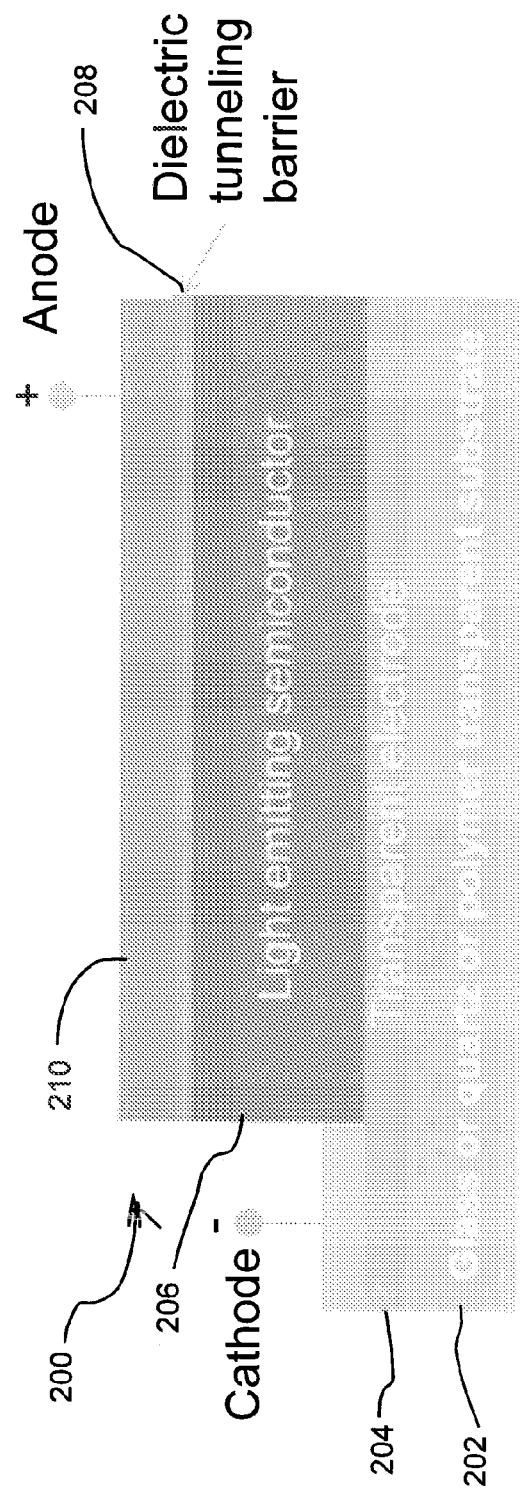
FIG. 11B shows an example anode/dielectric barrier/light emitter/transparent cathode.
Figure 12A:
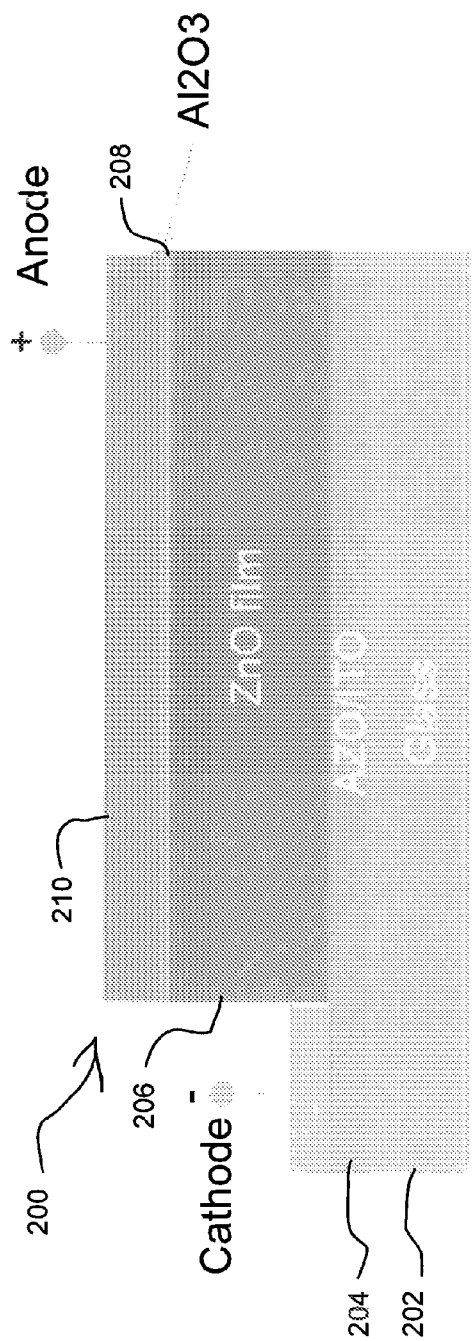
FIG. 12A shows an embodiment solid state J-LED.
Figure 12B:
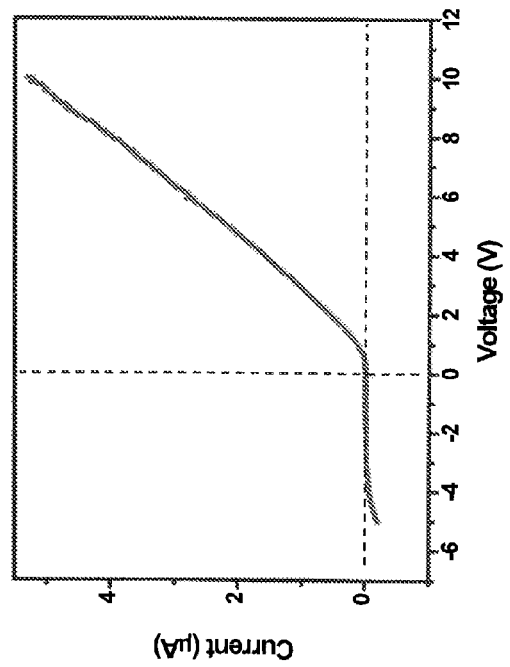
FIG. 12B shows rectifying I-V of the solid state J-LED.

FIG. 11B shows an example solid state J-LED, generally indicated as 200. The solid state J-LED includes a transparent substrate 202, for instance a glass, quartz, or polymer (or other materials) transparent substrate. A transparent electrode 204 (e.g., ohmic contact) provides the cathode. Light emitting semiconductor material 206 is disposed on the cathode 204, such as the light emitting semiconductor material used in other examples. A dielectric tunneling barrier 208 is disposed over the light emitting semiconductor material 206. An anode 210 (e.g., SC) is disposed over the dielectric tunneling barrier 208. FIG. 12A shows nonlimiting example materials for the solid state J-LED 200 of FIG. 11B. In FIG. 12A, the dielectric tunnel barrier 208 material is $Al_2O_3$. The example light emitting semiconductor material 206 is provided by a ZnO thin film. AZO/ITO is provided for the transparent ohmic contact. Other suitable dielectric tunneling barrier materials include, but are not limited to, $SiO_2$, $Si_3N_4$, $HfO_2$, $ZrO_2$, etc. FIG. 12B shows rectifying I-V of the example solid state J-LED 200 shown in FIG. 12A.

Figure 13B:
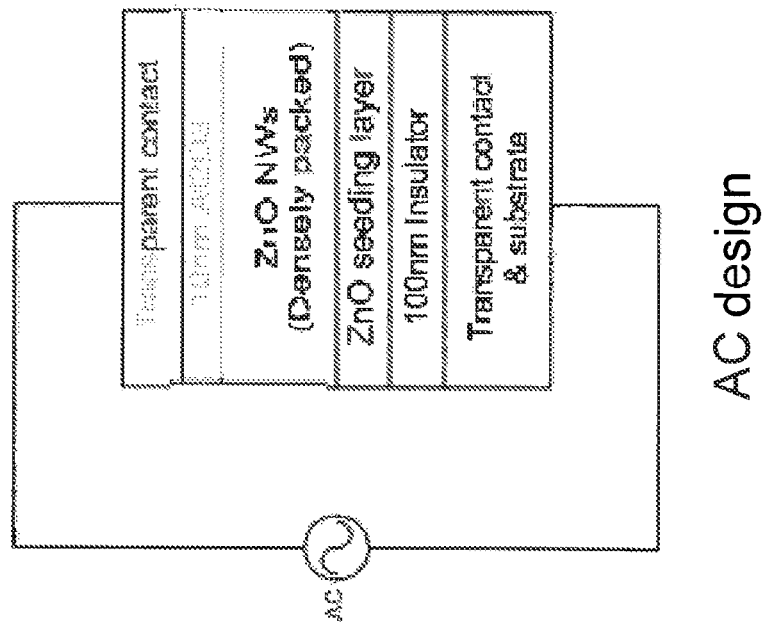
FIGS. 13A-13B show embodiment DC (FIG. 13A) and AC (FIG. 13B) operated solid state J-LEDs based on ZnO NWs.
Figure 13A:
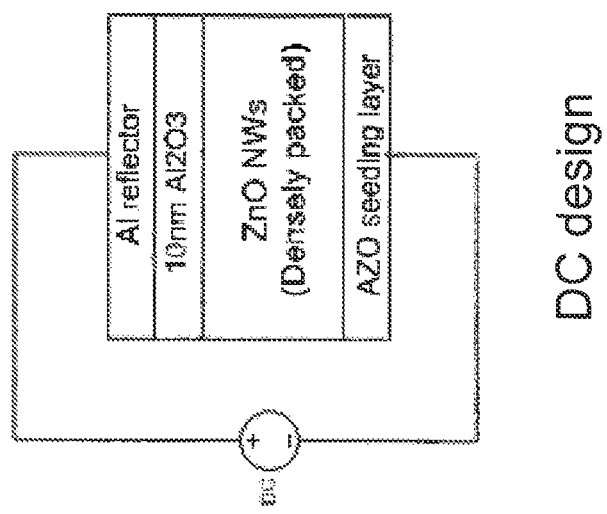

As with example J-LEDs with vacuum tunneling barriers, AC devices and operation can also be provided for solid state J-LEDs. FIGS. 13A-13B compare an example DC solid state J-LED 220 (FIG. 13A) and an example AC solid state J-LED 222 (FIG. 13B) operated based on ZnO NWs. The example DC solid state J-LED 220 includes an AZO seeding layer, a layer of light emitting semiconductor material (e.g., ZnO NWs, densely packed), a layer of $Al_2O_3$ (e.g., 10 nm), and an Al reflector. The example AC solid state J-LED 222 includes a bottom transparent contact and substrate, an insulator (e.g., 100 nm), a ZnO seeding layer, a layer of light emitting semiconductor material (e.g., ZnO NWs, densely packed), a layer of $Al_2O_3$ (e.g., 10 nm), and an upper transparent contact. Color tuning, mixing, or both can be done by selection of semiconductors with different bandgaps (resulting in different color) of the use of PL phosphors in ways similar to those for planar LED technologies.

An example embodiment J-LED can provide design, fabrication, manufacturing of LEDs from any light emitting materials without the limitation of formation or fabrication of p/n junctions and the constraints of p- or n-doping in certain semiconductors. This can lead to low cost LEDs. Example J-LEDs have advantages compared to planar LED technology (GaInAsP, GaN, ZnO, etc.), vertical ZnO and GaN nanowire array LEDs and optically pumped lasers, and injection light emitting diodes (i-LEDs). Example J-LEDs can provide improved light efficiency, better color, and good durability, and can be relatively ecological in manufacture, operation and recycling.

Example J-LEDs have broad application for solid-state lighting, display, signage, decoration lighting, medical (UV LED for water treatment, hygiene, etc.), sensing, scientific instrumentation, etc. and in essentially any field in which current planar LED are or could be applied. Example applications include general illumination, lasers, electro-optical communications, backlighting for displays, blue LEDs, and light therapy devices.

As one particular example, lasers (junctionless laser diode, or J-LDs) can be constructed with uniform single composition thin film, NWs, axial and radial heterostructures, and more complex structures with Febry-Perot cavities between the electrodes (floating electrode and the Schottky bottom anode electrode in the light emitting module, such as but not limited to that shown in FIGS. 1A-1B, 2E, and 8A). Based on particular lasers, the thickness of semiconductor between the top and both metal thin film can be tailored for reflection, and the light can be waveguided and amplified in thin film (or NWs) and emit from, e.g., the side of thin film or from the top of NWs. Furthermore, Bragg reflectors (diffractors) can also be constructed to enhance the cavity and amplification. Circular or ring structures of the semiconductor (gain media) can also be constructed for the whisper-gallery mode ting lasers.

Though particular example materials have been shown and described, it will be appreciated that many other materials are possible for features of example J-LEDs. For example, light emitting semiconductor materials can include, but are not limited to, III-V and II-VI compound semiconductors and oxides, including but not limited to $Al_xIn_yGa_{(1-x-y)}P_zAs_{(1-z)}$, $Al_xIn_yGa_{(1-x-y)}P_zAs_{(1-z)}$:N (dilute nitride), $Al_xIn_yGa_{(1-x-y)}N$, ZnMgCdO, ZnBeCdO, etc. light emitting organic small molecule and polymeric materials.

The materials can be in thin film, vertical nanowires, nanotubes, etc. formats. Nanowires can be grown by any of the methods currently available, including Chemical Vapor Deposition (CVD), Metal Organic Chemical Vapor Deposition (MOCVD), Molecular and Chemical Beam Epitaxy (CBE and MBE), solution syntheses, and Template-assisted electrochemical syntheses etc. For example nanowire array growth, substrates can be patterned using either nanoimprinting (NIL) or lithography (electron beam lithography or photolithography). Nanowire arrays can be grown using CVD, MOCVD, MBE via VLS, VSS or selective area epitaxy methods, among other examples. Nanowires or nanowire arrays could also be grown using methods to-be-known.

Example substrates include, but are not limited to, conducting substrates (can be transparent in particular embodiments), such as ITO and FTO glasses, quartz, degenerated doped Si, copper, stainless steel, etc. For solution growth substrates can also come be provided by metal coated substrates that later serve as electrodes.

Nonlimiting example materials for electron emitters (cathodes) include NWs, CNT, W tips, LaF6, etc. Nonlimiting example cathodes can be fabricated on small ball shape tip, flat planar surface, or curved surface (wires or metal wire grads), etc. by the methods including, but not limited to CVD/MOCVD growth, etching, bonding, sintering, and printing (contact, screen, ink-jet, gravure, etc). Nonlimiting example materials for anodes include Schottky metal contacts, which, depending on the specific material choices, can in some examples serve functions as both electrical contact and light reflector. Example materials also include top metal plate reflector (floating electrode) material such as, but not limited to, Al, Au, Ag, Ti, etc.

LEDs can be constructed, as nonlimiting examples, using uniform thin film (heterojunction, MQWs, superlattice, etc.) or NWs (uniform, radial and axial heterostructures: (1) n-nanowire core/p-coating LEDs, (2) p-nanowire core/n-shell LEDs; (3) axial heterostructure nanowires (superlattices) along nanowire direction) from bottom-up growth or top-down etching from a layered structure).

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

The invention claimed is:

1. A junctionless light emitting device comprising:
   a field emitter cathode that generates injection electrons; and
   a light emitting semiconductor material sandwiched between a floating ohmic contact (OC) and a Schottky contact (SC), an interface between the Schottky contact and the light emitting semiconductor material forming a Schottky junction;
   wherein the ohmic contact receives injection of the injection electrons from the field emitter cathode; and
   contacts for applying a voltage bias across the Schottky contact and the field emitter cathode to induce hole injection from the Schottky contact as a result of the injection electrons increasing a voltage drop between the ohmic contact and the Schottky contact and reducing a Schottky barrier of the Schottky junction.

2. The device of claim 1, wherein the light emitting semiconductor material consists of one of a thin film and nanostructures in contact with the Schottky contact to form the Schottky junction.

3. The device of claim 1, wherein the ohmic contact is separated from the field emitter cathode by an injection barrier.

4. The device of claim 3, wherein the injection barrier comprises a vacuum.

5. The device of claim 4, further comprising:
   a vacuum enclosure housing at least the field emitter cathode, the light emitting semiconductor material, the ohmic contact (OC), and the Schottky contact (SC).

6. The device of claim 1
   wherein the ohmic contact is separated from the field emitter cathode by an injection barrier;

wherein the injection barrier comprises a solid state dielectric material.

7. The device of claim 1, further comprising:
a light transmissive substrate, wherein the light emitting semiconductor material, the ohmic contact (OC), and the Schottky contact (SC) are disposed on the light transmissive substrate to provide a light emitting anode.

8. The device of claim 7, wherein the Schottky contact comprises a thin film grid disposed on the light transmissive substrate.

9. The device of claim 7, further comprising:
a phosphor coating disposed on the light transmissive substrate.

10. The device of claim 9, wherein the light emitting semiconductor material is configured to emit ultraviolet (UV) light.

11. The device of claim 9, wherein the phosphor coating provides color tuning for the device.

12. The device of claim 9,
wherein the phosphor coating comprises a plurality of phosphors mixed such that the device emits substantially white light.

13. A junctionless light emitting device comprising:
a field emitter cathode; and
a light emitting semiconductor material sandwiched between an ohmic contact (OC) that faces the injected electrons and a Schottky contact (SC);
wherein the field emitter cathode is configured to inject electrons into the ohmic contact, and
wherein the light emitting semiconductor material comprises nanowires.

14. The device of claim 13, wherein the nanowires comprise an array of nanowires.

15. The device of claim 13, wherein the ohmic contact comprises a metal film disposed on tips of the nanowires.

16. The device of claim 13, wherein the light emitting semiconductor material comprises nanowires;
wherein the nanowires comprise nanowires having a plurality of different bandgaps to thereby emit photons of different wavelengths.

17. The device of claim 16, wherein the emitted photons from the nanowires are mixed to provide substantially white light.

18. The device of claim 1, wherein the field emitter cathode comprises nanowires.

19. A method of operating a device of claim 3, comprising:
applying a voltage differential across the field emitter cathode and the SC to create small voltage drop between the floated OC and the SC, an electric field across the light emitting semiconductor material, the voltage drop being sufficiently small to limit injection of holes into the light emitting semiconductor material from the SC; and
emitting electrons from the field-emitting cathode and injecting the electrons into the floated OC;
increasing the voltage drop between the floating OC and the SC across the light emitting semiconductor material as a result of the injecting the electrodes to lower the Schottky barrier;
injecting holes into the light emitting semiconductor material from the SC as a result of the injecting holes;
recombining the injected holes from the SC and the injected electrons from the OC in the light emitting semiconductor material;
emitting photons from the light emitting semiconductor material as result of the recombining.

* * * * *